(12) United States Patent
Davis et al.

(10) Patent No.: US 7,957,139 B2
(45) Date of Patent: Jun. 7, 2011

(54) ELECTRONIC EQUIPMENT ENCLOSURE WITH SIDE-TO-SIDE AIRFLOW CONTROL SYSTEM

(75) Inventors: Jared Keith Davis, Cedar Park, TX (US); Samuel Rodriguez, Leander, TX (US)

(73) Assignee: Chatsworth Products, Inc., Westlake Village, CA (US)

( * ) Notice: Subject to any disclaimer, the term of this patent is extended or adjusted under 35 U.S.C. 154(b) by 0 days.

(21) Appl. No.: 12/652,136

(22) Filed: Jan. 5, 2010

(65) Prior Publication Data

US 2010/0172092 A1    Jul. 8, 2010

Related U.S. Application Data

(60) Provisional application No. 61/142,628, filed on Jan. 5, 2009.

(51) Int. Cl.
*H05K 7/20* (2006.01)
(52) U.S. Cl. .................. 361/690; 361/692; 454/184
(58) Field of Classification Search .................. None
See application file for complete search history.

(56) References Cited

U.S. PATENT DOCUMENTS

| | | |
|---|---|---|
| 3,192,306 A | 6/1965 | Skonnord |
| 3,364,838 A | 1/1968 | Bradley |
| 3,404,931 A | 10/1968 | Fall et al. |
| 3,563,627 A | 2/1971 | Whipps |
| 4,467,584 A | 8/1984 | Crites et al. |
| 4,495,545 A * | 1/1985 | Dufresne et al. .............. 361/695 |
| 4,592,602 A | 6/1986 | Kuster et al. |
| 4,774,631 A | 9/1988 | Okuyama et al. |
| 5,165,770 A | 11/1992 | Hahn |
| 5,216,579 A | 6/1993 | Basara et al. |
| 5,460,441 A | 10/1995 | Hastings et al. |

(Continued)

FOREIGN PATENT DOCUMENTS

DE        2509487 A1    9/1976

(Continued)

OTHER PUBLICATIONS

Rasmussen, Neil, White Paper #55, Air Distribution Architecture Options for Mission Critical Facilities, APC Legendary Reliability, 2003 American Power Conversion, Rev 2003-0, 13 pages, www.apc.com.

(Continued)

*Primary Examiner* — Boris L Chervinsky
(74) *Attorney, Agent, or Firm* — Tillman Wright, PLLC; James D. Wright; Chad D. Tillman

(57) ABSTRACT

An electronic equipment enclosure system with a side-to-side airflow control system includes an enclosure, having a front, a rear, a top, a bottom and two sides, and a side-to-side airflow control system. The airflow control system includes a side wall disposed adjacent one side of the enclosure, and a manifold disposed adjacent the other side of the enclosure. Electronic equipment having a front, a rear, a top, a bottom and two sides is disposed between the side wall and the manifold. Cooling air is routed into a first of the two sides of the electronic equipment, and heated exhaust air is routed out of a second side of the two sides of the electronic equipment and into the manifold. The side wall prevents the heated exhaust air from mixing with the cooling air at the first side of the electronic equipment.

21 Claims, 15 Drawing Sheets

U.S. PATENT DOCUMENTS

| | | | |
|---|---|---|---|
| 5,528,454 A | 6/1996 | Niklos | |
| 5,544,012 A | 8/1996 | Koike | |
| 5,570,740 A | 11/1996 | Flores et al. | |
| 5,671,805 A | 9/1997 | Stahl et al. | |
| 5,798,485 A | 8/1998 | Rohde et al. | |
| 5,851,143 A | 12/1998 | Hamid | |
| 5,901,033 A | 5/1999 | Crawford et al. | |
| 5,941,767 A | 8/1999 | Fukuda | |
| 5,995,368 A | 11/1999 | Lee et al. | |
| 5,997,117 A | 12/1999 | Krietzman | |
| 6,034,873 A | 3/2000 | Stahl et al. | |
| 6,036,290 A | 3/2000 | Jancsek et al. | |
| 6,044,193 A | 3/2000 | Szentesi et al. | |
| 6,067,233 A | 5/2000 | English et al. | |
| 6,104,003 A | 8/2000 | Jones | |
| 6,127,663 A | 10/2000 | Jones | |
| 6,163,454 A | 12/2000 | Strickler | |
| 6,185,098 B1 | 2/2001 | Benavides | |
| 6,198,628 B1 | 3/2001 | Smith | |
| 6,222,729 B1 | 4/2001 | Yoshikawa | |
| 6,381,147 B1 | 4/2002 | Hayward et al. | |
| 6,459,579 B1 | 10/2002 | Farmer et al. | |
| 6,462,944 B1 | 10/2002 | Lin | |
| 6,554,697 B1 | 4/2003 | Koplin | |
| 6,557,357 B2 | 5/2003 | Spinazzola et al. | |
| 6,574,970 B2 | 6/2003 | Spinazzola et al. | |
| 6,601,932 B1 | 8/2003 | Helgenberg et al. | |
| 6,611,428 B1 * | 8/2003 | Wong | 361/695 |
| 6,616,524 B2 | 9/2003 | Storck, Jr. et al. | |
| 6,646,878 B2 | 11/2003 | Chan | |
| 6,652,373 B2 | 11/2003 | Sharp et al. | |
| 6,668,565 B1 | 12/2003 | Johnson et al. | |
| 6,672,955 B2 | 1/2004 | Charron | |
| 6,704,196 B1 | 3/2004 | Rodriguez et al. | |
| 6,745,579 B2 | 6/2004 | Spinazzola et al. | |
| 6,788,535 B2 | 9/2004 | Dodgen et al. | |
| 6,819,563 B1 | 11/2004 | Chu et al. | |
| 6,912,131 B2 | 6/2005 | Kabat | |
| 7,011,576 B2 | 3/2006 | Sharp et al. | |
| 7,016,194 B1 | 3/2006 | Wong | |
| 7,033,267 B2 | 4/2006 | Rasmussen | |
| 7,074,123 B2 | 7/2006 | Bettridge et al. | |
| 7,112,131 B2 | 9/2006 | Rasmussen et al. | |
| 7,144,320 B2 * | 12/2006 | Turek et al. | 454/184 |
| 7,154,748 B2 | 12/2006 | Yamada | |
| 7,182,208 B2 | 2/2007 | Tachibana | |
| 7,212,403 B2 | 5/2007 | Rockenfeller | |
| 7,236,362 B2 | 6/2007 | Wang et al. | |
| 7,255,640 B2 | 8/2007 | Aldag et al. | |
| 7,259,961 B2 | 8/2007 | Lucero et al. | |
| 7,259,963 B2 | 8/2007 | Germagian et al. | |
| 7,286,345 B2 | 10/2007 | Casebolt | |
| 7,293,666 B2 | 11/2007 | Mattlin et al. | |
| 7,309,279 B2 | 12/2007 | Sharp et al. | |
| 7,349,209 B2 | 3/2008 | Campbell et al. | |
| 7,355,850 B2 | 4/2008 | Baldwin | |
| 7,372,695 B2 | 5/2008 | Coglitore et al. | |
| 7,425,678 B2 | 9/2008 | Adducci et al. | |
| 7,427,713 B2 | 9/2008 | Adducci et al. | |
| 7,438,124 B2 * | 10/2008 | Bhatti et al. | 165/248 |
| 7,438,638 B2 | 10/2008 | Lewis et al. | |
| 7,472,970 B2 | 1/2009 | Bergesch et al. | |
| 7,485,803 B2 | 2/2009 | Adducci et al. | |
| 7,486,512 B2 | 2/2009 | Campbell et al. | |
| 7,495,169 B2 | 2/2009 | Adducci et al. | |
| 7,500,911 B2 | 3/2009 | Johnson et al. | |
| 7,504,581 B2 | 3/2009 | Adducci et al. | |
| 7,508,663 B2 | 3/2009 | Coglitore et al. | |
| 7,542,287 B2 | 6/2009 | Lewis, II et al. | |
| 7,604,535 B2 | 10/2009 | Germagian et al. | |
| 7,697,285 B2 | 4/2010 | Donowho et al. | |
| 7,746,637 B2 | 6/2010 | Donowho et al. | |
| 7,752,858 B2 | 7/2010 | Johnson et al. | |
| 7,764,495 B2 * | 7/2010 | Hruby et al. | 361/692 |
| 7,804,685 B2 | 9/2010 | Krietzman | |
| 2002/0101721 A1 | 8/2002 | Blood | |
| 2004/0007348 A1 | 1/2004 | Stoller | |
| 2004/0050808 A1 | 3/2004 | Krampotich et al. | |
| 2004/0099747 A1 | 5/2004 | Johnson et al. | |
| 2004/0182799 A1 | 9/2004 | Tachibana | |
| 2004/0190270 A1 | 9/2004 | Aldag et al. | |
| 2005/0153649 A1 | 7/2005 | Bettridge et al. | |
| 2005/0170770 A1 | 8/2005 | Johnson et al. | |
| 2005/0225936 A1 | 10/2005 | Day | |
| 2005/0237716 A1 | 10/2005 | Chu et al. | |
| 2006/0141921 A1 | 6/2006 | Turek et al. | |
| 2006/0276121 A1 | 12/2006 | Rasmussen | |
| 2007/0064389 A1 | 3/2007 | Lewis et al. | |
| 2007/0064391 A1 | 3/2007 | Lewis et al. | |
| 2007/0171610 A1 | 7/2007 | Lewis | |
| 2007/0173189 A1 | 7/2007 | Lewis | |
| 2007/0183129 A1 | 8/2007 | Lewis et al. | |
| 2007/0210679 A1 | 9/2007 | Adducci et al. | |
| 2007/0210680 A1 | 9/2007 | Appino et al. | |
| 2007/0210681 A1 | 9/2007 | Adducci et al. | |
| 2007/0210683 A1 | 9/2007 | Adducci et al. | |
| 2007/0210686 A1 | 9/2007 | Adducci et al. | |
| 2007/0221393 A1 | 9/2007 | Adducci et al. | |
| 2008/0007911 A1 * | 1/2008 | Hallin et al. | 361/687 |
| 2008/0035810 A1 | 2/2008 | Lewis | |
| 2008/0037228 A1 | 2/2008 | Lewis | |
| 2008/0062654 A1 | 3/2008 | Mattlin et al. | |
| 2008/0068791 A1 | 3/2008 | Ebermann | |
| 2008/0174217 A1 | 7/2008 | Walker | |
| 2008/0266789 A1 | 10/2008 | Hruby et al. | |
| 2008/0316702 A1 | 12/2008 | Donowho et al. | |
| 2008/0316703 A1 | 12/2008 | Donowho et al. | |
| 2009/0061755 A1 | 3/2009 | Calder et al. | |
| 2009/0129013 A1 | 5/2009 | Donowho et al. | |
| 2009/0190307 A1 | 7/2009 | Krietzman | |
| 2009/0227197 A1 | 9/2009 | Lewis et al. | |
| 2009/0239460 A1 | 9/2009 | Lucia et al. | |
| 2009/0239461 A1 | 9/2009 | Lewis et al. | |
| 2009/0273915 A1 | 11/2009 | Dean, Jr. et al. | |
| 2010/0061059 A1 | 3/2010 | Krietzman et al. | |
| 2010/0172093 A1 | 7/2010 | Davis et al. | |

FOREIGN PATENT DOCUMENTS

| | | |
|---|---|---|
| EP | 2205054 A1 | 7/2010 |
| GB | 2354066 A | 3/2001 |
| JP | 2000193792 A | 7/2000 |
| JP | 2000286580 | 10/2000 |
| JP | 2003056993 A | 2/2003 |
| JP | 2004200594 | 7/2004 |
| JP | 2004252758 | 9/2004 |
| JP | 2007212092 A | 8/2007 |
| WO | 9948305 | 9/1999 |
| WO | 2006055506 A2 | 5/2006 |
| WO | 2008022058 A2 | 2/2008 |
| WO | 2008022058 A3 | 11/2008 |
| WO | 2008144678 A1 | 11/2008 |
| WO | 2009089008 A2 | 7/2009 |
| WO | 2009103090 A2 | 8/2009 |
| WO | 2009103090 A3 | 10/2009 |
| WO | 2010028384 A2 | 3/2010 |

OTHER PUBLICATIONS

"International Search Report" and "Written Opinion of the International Search Authority" (Korean Intellectual Property Office) in Chatsworth Products, Inc. et al., International Patent Application Serial No. PCT/US2008/064174, Applicant's file reference, filed May 19, 2008, dated Oct. 30, 2008, 9 pages.

"International Search Report" and "Written Opinion" of the International Search Authority (Korean Intellectual Property Office) in Chatsworth Products, Inc. et al., International Patent Application Serial No. PCT/US2009/034338, Applicant's file reference, filed on Feb. 17, 2009 mailed on Sep. 1, 2009 and completed on Aug. 31, 2009, 7 pages.

Thermal Management Solutions, CPI Passive Cooling Solutions, Signature Solutions, Rev. Mar. 2008, 6 pages, www.chatsworth.com/passivecooling, Chatsworth Products, Inc.

"International Search Report" and "Written Opinion of the International Searching Authority" (ISA/US Alexandria, Virginia Office) in Chatsworth Products, Inc. et al., International Patent Application Serial No. PCT/US07/75763, Applicant's file reference, dated Aug. 13, 2008, 13 pages.

Information Disclosure Statement (IDS) Letter Regarding Common Patent Application(s) dated Apr. 21, 2010.

"International Search Report" and "Written Opinion of the International Searching Authority" (ISA/US Korean Intellectual Propery Office) in Chatsworth Products, Inc. et al., International Patent Application Serial No. PCT/US2009/056256, Applicant's file reference, International Filing Date Sep. 8, 2009, Mailed on Apr. 7, 2010, Completed on Apr. 6, 2010, 7 pages.

Information Disclosure Statement (IDS) Letter Regarding Common Patent Application(s), dated Sep. 1, 2010.

Information Disclosure Statement (IDS) Letter Regarding Common Patent Application(s), dated Oct. 22, 2010.

* cited by examiner

ELECTRONIC EQUIPMENT ENCLOSURE WITH SIDE-TO-SIDE AIRFLOW CONTROL SYSTEM

CROSS-REFERENCE TO RELATED APPLICATION

The present application is a U.S. nonprovisional patent application of, and claims priority under 35 U.S.C. §119(e) to, U.S. provisional patent application Ser. No. 61/142,628, filed Jan. 5, 2009, which provisional patent application is incorporated by reference herein.

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE PRESENT INVENTION

1. Field of the Present Invention

The present invention generally relates to air flow management within an electronic equipment enclosure, and in particular to, a side-to-side airflow control system to promote cooling of server equipment that utilizes side-to-side airflow.

2. Background

Racks, frames, cabinets and the like for supporting computer and other electronic equipment are well known. Such support apparatus are often partially or fully enclosed, either directly through the use of doors and panels mounted directly thereon, or indirectly by lining several such apparatuses up in a row such that the sides of each rack are immediately adjacent another rack.

As is also well known, the electronic equipment mounted therein tends to generate large amounts of heat that need to be exhausted away from the equipment effectively in order to maintain the equipment in proper operating order or to prevent damage thereto. As equipment has become more densely packed with electronics, the quantities of heat have continued to increase in recent years. Heat management has thus become a significant issue confronting today's rack, cabinet, frame and enclosure manufacturers, the manufacturers of the electronic equipment, and the users of such equipment.

Each piece of equipment is often enclosed within an individual chassis or housing that includes a location, typically referred to as an exhaust grille, where air that has been circulated therethrough is exhausted. The heated air is frequently forced or forcibly drawn out of the various active pieces of equipment through exhaust grilles of the equipment by internal fans, often supplemented by separate fans mounted in or on the enclosure. In many pieces of equipment, the exhaust grille is located on the rear of the equipment, and the equipment is often cooled by bringing cool air to the front of the equipment and exhausted through the rear, often through a door or through exhaust openings in a panel. Other equipment uses the opposite configuration, wherein cool air is brought to the rear of the equipment and exhausted through the front; this may be handled generally similarly as the rear exhaust except that the front and rear of the cabinet are generally reversed.

However, other equipment is arranged to receive cold air from the side and to exhaust heated air from the opposite side. For example, a common piece of electronic equipment in modern computer networks is a switch. Switches tend to generate a significant amount of heat, and therefore are of particular concern in exhausting heat from an electronic equipment enclosure, and at least some are manufactured with inlets on one side and exhaust grilles on the other side. Such equipment requires different treatment than front/rear exhaust equipment.

Currently, in order to remove heated switch exhaust air from the side of an electronic equipment enclosure, the switch exhaust grille is coupled with or connected to an individual exhaust duct that is specifically designed and sized to fit the particular type of switch being used. It is important that the switch grille and the exhaust duct inlet are similarly sized so that exhaust air is routed outside of the enclosure through the duct rather than being released into the interior of the enclosure where it would adversely affect the equipment stored therein. Because of the individual sizing, a different exhaust duct must be used for differently sized switches.

One solution has been presented in commonly-assigned U.S. patent application Ser. No. 12/123,453, published as US 2008/0316702 A1 (the "'453 application"), which is incorporated herein by reference. In particular, adjustable filler panels are disclosed for more precisely controlling airflow above and below side inlets and outlets in certain types of side-to-side equipment. However, such an arrangement presents only a partial solution. In particular, such an arrangement does not work well with exhaust ducts located at the top of the enclosure, particularly on the top panel thereof.

A more versatile, adjustable solution is thus needed.

SUMMARY OF THE PRESENT INVENTION

The present invention according to a first aspect is an electronic equipment enclosure with a side-to-side airflow control system, as shown and described.

The present invention according to a second aspect is a side-to-side airflow control system, for an electronic equipment enclosure, as shown and described.

The present invention according to a third aspect is a manifold for a side-to-side airflow control system, in an electronic equipment enclosure, as shown and described.

The present invention according to a fourth aspect is an electronic equipment enclosure with a side-to-side airflow control system, for providing exhaust of heated air through an opening in a top panel of the enclosure, as shown and described.

The present invention according to a fifth aspect is a side-to-side airflow control system, for providing exhaust of heated air through an opening in a top panel of an electronic equipment enclosure, as shown and described.

The present invention according to a sixth aspect is an electronic equipment enclosure, having a front plenum, a right side plenum, a left side plenum, and a rear plenum, as shown and described.

The present invention according to a seventh aspect is an electronic equipment enclosure system with a side-to-side airflow control system, including: an enclosure, having a front, a rear, a top, a bottom and two sides; a side-to-side airflow control system, having a side wall disposed adjacent one side of the enclosure, and a manifold disposed adjacent the other side of the enclosure.

In a feature of this aspect, the system further includes electronic equipment disposed between the side wall and the manifold.

In further features, the electronic equipment has a front, a rear, a top, a bottom and two sides; cooling air is routed into a first of the two sides of the electronic equipment; heated exhaust air is routed out of a second side of the two sides of the electronic equipment and into the manifold; and the side wall prevents the heated exhaust air from mixing with the cooling air at the first side of the electronic equipment. In still further features, the enclosure system further includes an opening in the top of the enclosure and an exhaust duct on the top of the enclosure and in fluid communication with the interior of the enclosure via the opening; and the side-to-side airflow control system is adapted to route heated exhaust air from the manifold through an opening in the top of the enclosure and into an exhaust duct disposed on the top of the enclosure.

In other further features, the enclosure system further includes at least one adjustable filler panel assembly disposed above the electronic equipment to prevent air from passing from side to side over the electronic equipment; the enclosure system further includes at least one adjustable filler panel assembly disposed below the electronic equipment to prevent air from passing from side to side under the electronic equipment; the enclosure system further includes at least one front filler panel disposed above the electronic equipment to prevent air from passing from front to back over the electronic equipment; and/or the enclosure system further includes at least one front filler panel disposed below the electronic equipment to prevent air from passing from front to back under the electronic equipment.

The present invention according to an eighth aspect is a side-to-side airflow control system for an electronic equipment enclosure having a front, a rear, a top, a bottom and two sides, including: a side wall disposed adjacent one side of the enclosure; and a manifold disposed adjacent the other side of the enclosure.

In a feature of this aspect, the airflow control system further includes electronic equipment disposed between the side wall and the manifold.

In a further feature, the electronic equipment has a front, a rear, a top, a bottom and two sides, wherein cooling air is routed into a first of the two sides of the electronic equipment, wherein heated exhaust air is routed out of a second side of the two sides of the electronic equipment and into the manifold, and wherein the side wall prevents the heated exhaust air from mixing with the cooling air at the first side of the electronic equipment. In a still further feature, the system is adapted to route heated exhaust air from the manifold through an opening in the top of the enclosure and into an exhaust duct disposed on the top of the enclosure.

In other further features, the airflow control system further includes at least one adjustable filler panel assembly disposed above the electronic equipment to prevent air from passing from side to side over the electronic equipment; the airflow control system further includes at least one adjustable filler panel assembly disposed below the electronic equipment to prevent air from passing from side to side under the electronic equipment; the airflow control system further includes at least one front filler panel disposed above the electronic equipment to prevent air from passing from front to back over the electronic equipment; and/or the airflow control system further includes at least one front filler panel disposed below the electronic equipment to prevent air from passing from front to back under the electronic equipment.

The present invention according to a ninth aspect is a manifold for a side-to-side airflow control system, in an electronic equipment enclosure, including: an outer side wall; front and rear walls, each having an angled portion, extending substantially the full height of the manifold, for redirecting air striking thereagainst; a top wall; and a bottom wall; wherein an inward-facing inlet opening is defined at least partially by the front wall, the top wall, and the bottom wall; wherein an inward-facing exhaust opening is defined at least partially by the rear wall, the top wall, and the bottom wall; and wherein heated exhaust air enters the manifold through the inlet opening and exits the manifold through the exhaust opening.

In a feature of this aspect, at least a portion of the air entering the manifold through the inlet opening is redirected by the angled portion of the front wall toward the rear wall.

In another feature of this aspect, at least a portion of the air traveling from front to back within the manifold is redirected by the angled portion of the rear wall toward the exhaust opening.

In another feature of this aspect, the manifold further includes an inner mounting post, the inner mounting post opposing the outer side wall. In further features, the inner mounting post includes an inwardly-angled portion at the rear thereof; the inward-facing inlet opening is further defined by the front edge of the inner mounting post; and/or the inward-facing exhaust opening is further defined by the rear edge of the inner mounting post.

In another feature of this aspect, the manifold further includes at least one spacer connecting the inner mounting post to the outer side wall. In further features, the at least one spacer is planar in shape; and/or the at least one spacer is angled upwardly to redirect air upward when the air is passing through the manifold from front to rear.

The present invention according to a tenth aspect is an electronic equipment enclosure system with a side-to-side airflow control system, including: an enclosure, having a front, a rear, a top, a bottom and two sides; a manifold, having: an outer side wall, front and rear walls, each having an angled portion, extending substantially the full height of the manifold, for redirecting air striking thereagainst, a top wall, and a bottom wall, wherein an inward-facing inlet opening is defined at least partially by the front wall, the top wall, and the bottom wall, wherein an inward-facing exhaust opening is defined at least partially by the rear wall, the top wall, and the bottom wall, and wherein heated exhaust air enters the manifold through the inlet opening and exits the manifold through the exhaust opening.

In a feature of this aspect, at least a portion of the air entering the manifold through the inlet opening is redirected by the angled portion of the front wall toward the rear wall.

In another feature of this aspect, at least a portion of the air traveling from front to back within the manifold is redirected by the angled portion of the rear wall toward the exhaust opening.

In another feature of this aspect, the manifold further includes an inner mounting post, the inner mounting post opposing the outer side wall. In further features, the inner mounting post includes an inwardly-angled portion at the rear thereof; the inward-facing inlet opening is further defined by the front edge of the inner mounting post; the inward-facing exhaust opening is further defined by the rear edge of the inner mounting post; and/or the manifold further includes at least one spacer connecting the inner mounting post to the outer side wall. In still further features, the at least one spacer is planar in shape; and/or the at least one spacer is angled upwardly to redirect air upward when the air is passing through the manifold from front to rear.

The present invention according to an eleventh aspect is an electronic equipment enclosure system with a side-to-side airflow control system, including: an electronic equipment enclosure; panels that define a first plenum in a front region of the electronic equipment enclosure, a second plenum in a first side region of the electronic equipment enclosure, a third plenum in a second side region of the electronic equipment enclosure, and a fourth plenum in a rear region of the enclosure, wherein the second side region is on the opposite side of the enclosure from the first side region; wherein the first plenum is in fluid communication with the second plenum, the second plenum is in fluid communication with a first side of an equipment mounting location, the third plenum is in fluid communication with a second side of the equipment mounting location, the fourth plenum is in fluid communication with the third plenum, and the second side of the equipment mounting location is on the opposite side of the equipment mounting location from the first side thereof; and wherein the panels are arranged such that cooling air enters the first plenum, passes from the first plenum into the second plenum, passes from the second plenum through the equipment mounting location and into the third plenum as heated exhaust air, and the heated exhaust air passes from the third plenum into the fourth plenum.

In a feature of this aspect, the electronic equipment enclosure includes a top panel having an opening therein such that the heated exhaust air passes up and out of the enclosure through the opening. In further features, the electronic equipment enclosure system further includes an exhaust duct disposed on the top panel of the enclosure and in fluid communication with the opening in the top panel; and/or the third plenum is established by a manifold having an inward-facing inlet opening and an inward-facing exhaust opening. In still another feature of this aspect, a rear cover of the electronic equipment enclosure includes one or more perforations to permit cooling air to enter directly into the second plenum.

The present invention according to a twelfth aspect is a side-to-side airflow control system, for an electronic equipment enclosure, including: panels that define a first plenum in a front region of an electronic equipment enclosure, a second plenum in a first side region of the electronic equipment enclosure, a third plenum in a second side region of the electronic equipment enclosure, and a fourth plenum in a rear region of the enclosure, wherein the second side region is on the opposite side of the enclosure from the first side region; wherein the first plenum is in fluid communication with the second plenum, the second plenum is in fluid communication with a first side of an equipment mounting location, the third plenum is in fluid communication with a second side of the equipment mounting location, the fourth plenum is in fluid communication with the third plenum, and the second side of the equipment mounting location is on the opposite side of the equipment mounting location from the first side thereof; and wherein the panels are arranged such that cooling air enters the first plenum, passes from the first plenum into the second plenum, passes from the second plenum through the equipment mounting location and into the third plenum as heated exhaust air, and the heated exhaust air passes from the third plenum into the fourth plenum.

In a feature of this aspect, at least one spacer is arranged at the third plenum and angled upwardly to redirect the heated exhaust air upward when passing through the third plenum. In another feature of this aspect, the heated exhaust air is routed from the fourth plenum into an exhaust duct. In still another feature of this aspect, cooling air enters directly into the second plenum via one or more perforations in a rear panel of the electronic equipment enclosure The present invention according to a thirteenth aspect is an electronic equipment enclosure system, including: an enclosure, having a front, a rear, a top, a bottom and two sides; and a side-to-side airflow control system. The side-to-side airflow control system includes a side wall disposed adjacent one side of the enclosure and a manifold disposed adjacent the other side of the enclosure.

In a feature of this aspect, the electronic equipment system further includes electronic equipment disposed between the side wall and the manifold. The electronic equipment includes a front, a rear, a top, a bottom, and two sides. Cooling air is routed into a first of the two sides of the electronic equipment, heated exhaust air is routed out of a second side of the two sides of the electronic equipment and into the manifold, and the side wall prevents the heated exhaust air from mixing with the cooling air at the first side of the electronic equipment.

In further features of this aspect, the electronic equipment enclosure further includes an opening in the top of the enclosure and an exhaust duct on the top of the enclosure and in fluid communication with the interior of the enclosure via the opening; the side-to-side airflow control system is adapted to route heated exhaust air from the manifold through an opening in the top of the enclosure and into an exhaust duct disposed on the top of the enclosure; and the electronic equipment enclosure system further includes at least one adjustable filler panel assembly disposed above the electronic equipment to prevent air from passing from side to side over the electronic equipment, disposed below the electronic equipment to prevent air from passing from side to side under the electronic equipment, disposed above the electronic equipment to prevent air from passing from front to back over the electronic equipment, or disposed below the electronic equipment to prevent air from passing from front to back under the electronic equipment.

In another feature of this aspect, the manifold includes an outer side wall; front and rear walls, each having an angled portion, extending substantially the full height of the manifold, for redirecting air striking thereagainst; a top wall; and a bottom wall. An inward-facing inlet opening is defined at least partially by the front wall, the top wall, and the bottom wall; an inward-facing exhaust opening is defined at least partially by the rear wall, the top wall, and the bottom wall; and heated exhaust air enters the manifold through the inlet opening and exits the manifold through the exhaust opening.

In further features of this aspect, at least a portion of the air entering the manifold through the inlet opening is redirected by the angled portion of the front wall toward the rear wall; at least a portion of the air traveling from front to back within the manifold is redirected by the angled portion of the rear wall toward the exhaust opening; the manifold further includes an inner mounting post, the inner mounting post opposing the outer side wall; the inner mounting post includes an inwardly-angled portion at the rear thereof; the inward-facing inlet opening is further defined by the front edge of the inner mounting post; the inward-facing exhaust opening is further defined by the rear edge of the inner mounting post; the manifold further includes at least one spacer connecting the inner mounting post to the outer side wall; and the at least one spacer is angled upwardly to redirect air upward when the air is passing through the manifold from front to rear.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION

Figure 1A:
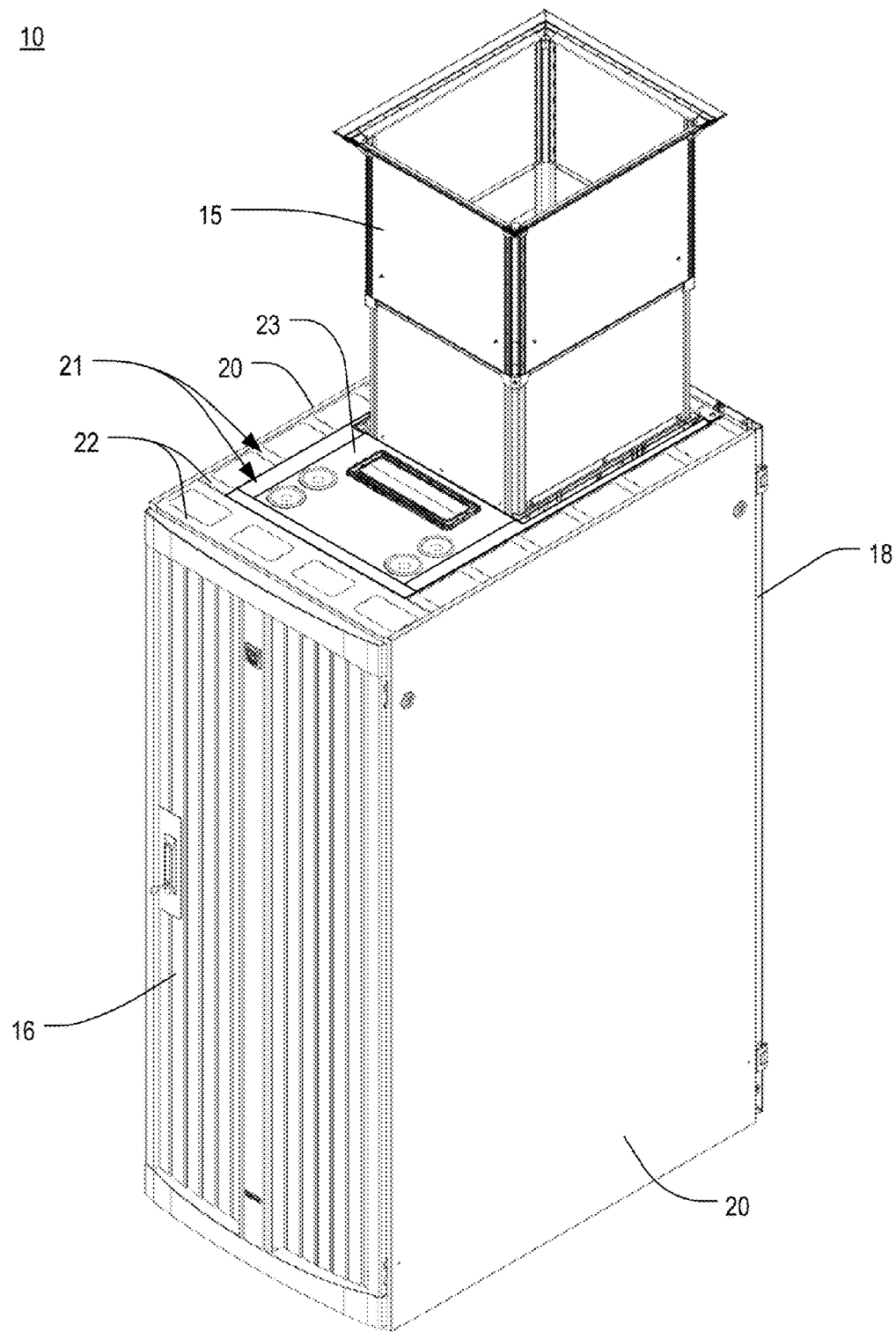
FIG. 1A is an isometric view of an electronic equipment enclosure system having a side-to-side airflow control system in accordance with one or more preferred embodiments of the present invention.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers," "a picnic basket having crackers without cheese," and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of one or more preferred embodiment(s) is merely exemplary in nature and is in no way intended to limit the invention, its application, or uses.

Figure 1B:
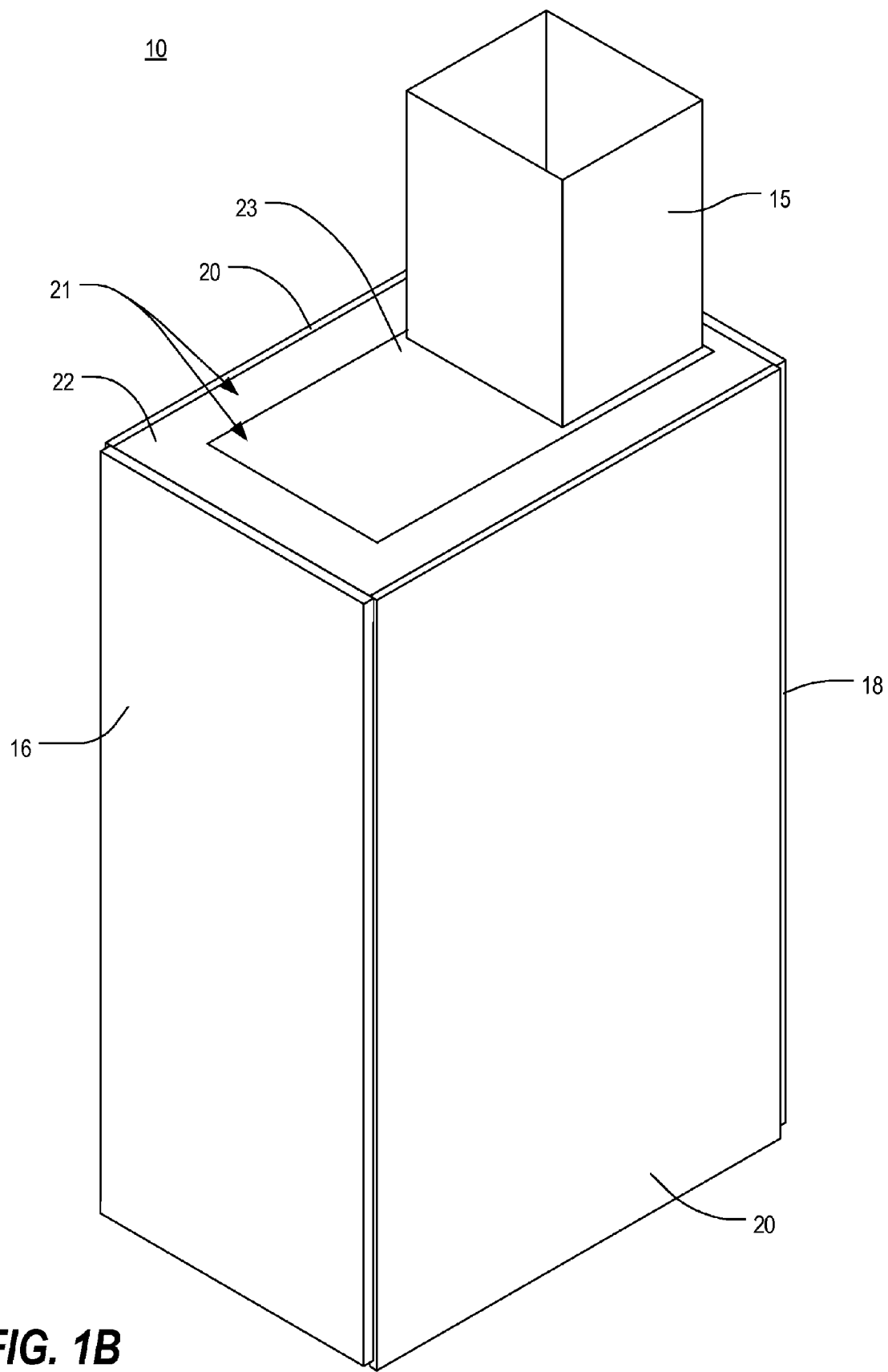
FIG. 1B is an isometric schematic view of the enclosure system of FIG. 1A.

FIG. 1A is an isometric view of an electronic equipment enclosure system 10 having a side-to-side airflow control system in accordance with one or more preferred embodiments of the present invention, and FIG. 1B is an isometric schematic view of the enclosure system 10 of FIG. 1A. As shown therein, the enclosure system 10, which may be generally conventional, includes a front panel 16, a rear panel 18, a pair of side panels 20, a top panel 21, and a vertical exhaust duct 15. In the illustrated embodiment, the front panel 16 is implemented as a single hinged door and the back panel 18 is implemented as a pair of hinged doors. In this regard, it will be apparent that various replacement components may be substituted for the components of the enclosure system, without departing from the scope of the present invention.

Furthermore, in the illustrated embodiment, the top panel 21 is illustrated as a central top panel 23 and a top panel extension kit 22, wherein the top panel extension kit 22 may include a plurality of top panel elements that are each coplanar with the central top panel 23, but other arrangements will be apparent to the Ordinary Artisan.

A vertical exhaust duct 15 suitable for use in the enclosure system 10 of FIGS. 1A and 1B is fully disclosed in commonly-assigned U.S. patent application Ser. No. 12/344,367, published as US 2009/0190307 A1 (the "'367 application"), which is incorporated herein by reference.

Figure 2:
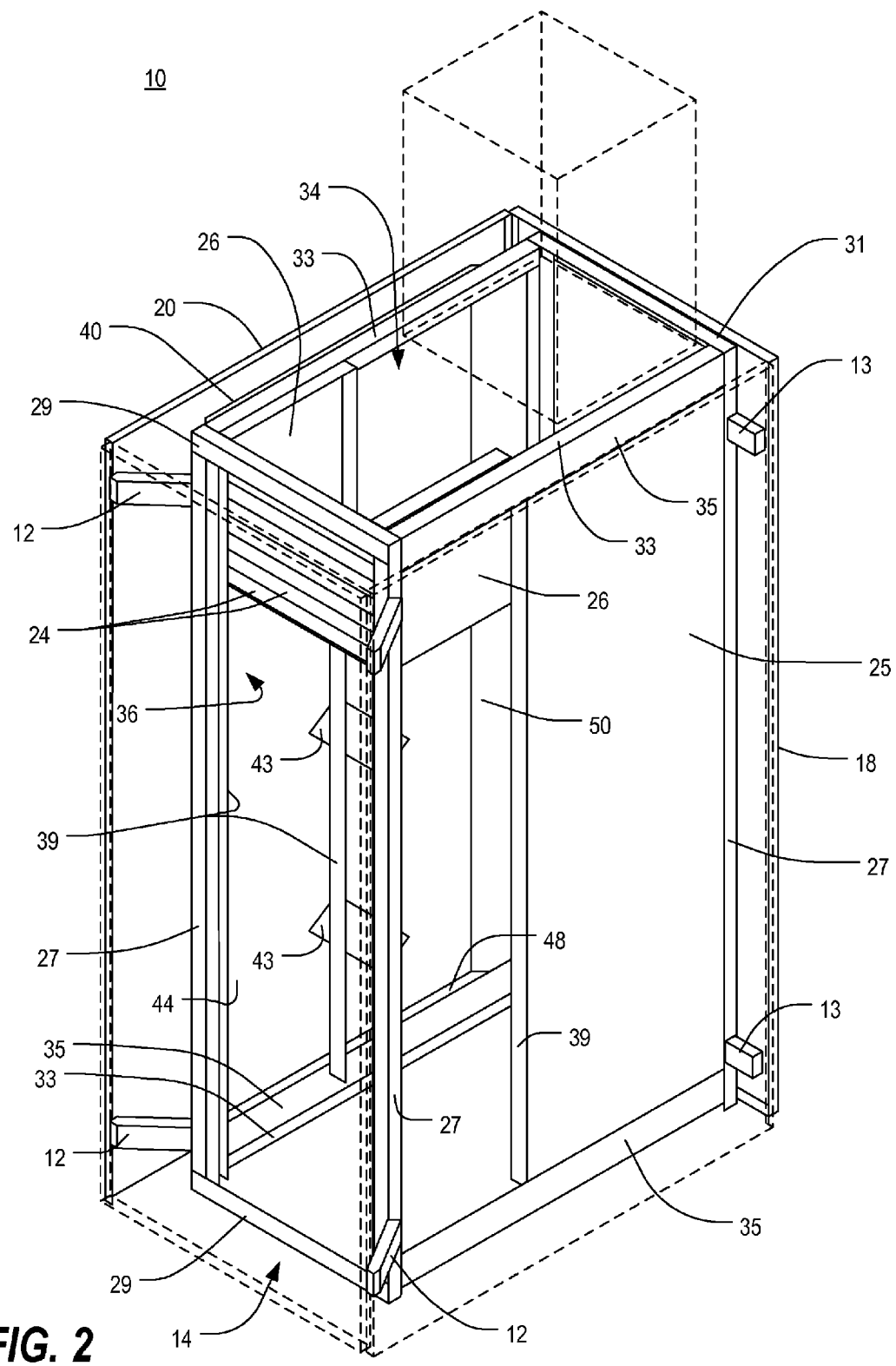
FIG. 2 is an isometric schematic view of the enclosure system of FIG. 1B, shown with the top panel, the right panel, the front panel and the vertical exhaust duct removed and their locations shown in broken lines.

FIG. 2 is an isometric schematic view of the enclosure system 10 of FIG. 1B, shown with the top panel, the right panel, the front panel and the vertical exhaust duct removed and their locations shown in broken lines. As illustrated therein, the various panels forming the enclosure are supported by offset brackets 12,13 that are connected to an interior four post frame structure 14. The interior four post frame structure 14, which may be of conventional design and construction, includes a plurality of frame members including four vertical members 27, upper and lower front cross members 29, upper and lower rear cross members 31 and two pairs of upper and lower side depth members 33. Each vertical member 27 includes a plurality of cross member attachment apertures at each end. Two of the vertical members 27 are connected together at their upper and lower ends by the upper and lower front cross members 29, respectively, and the other two vertical members 27 are connected together at their upper and lower ends by the upper and lower rear cross members 31, respectively. The front cross members 29 and their respective vertical members 27 thus define a front frame, and the rear cross members 31 and their respective vertical members 27 define a rear frame. The front and rear frames may then be connected together at their respective corners by the upper and lower depth members 33.

Figure 11:
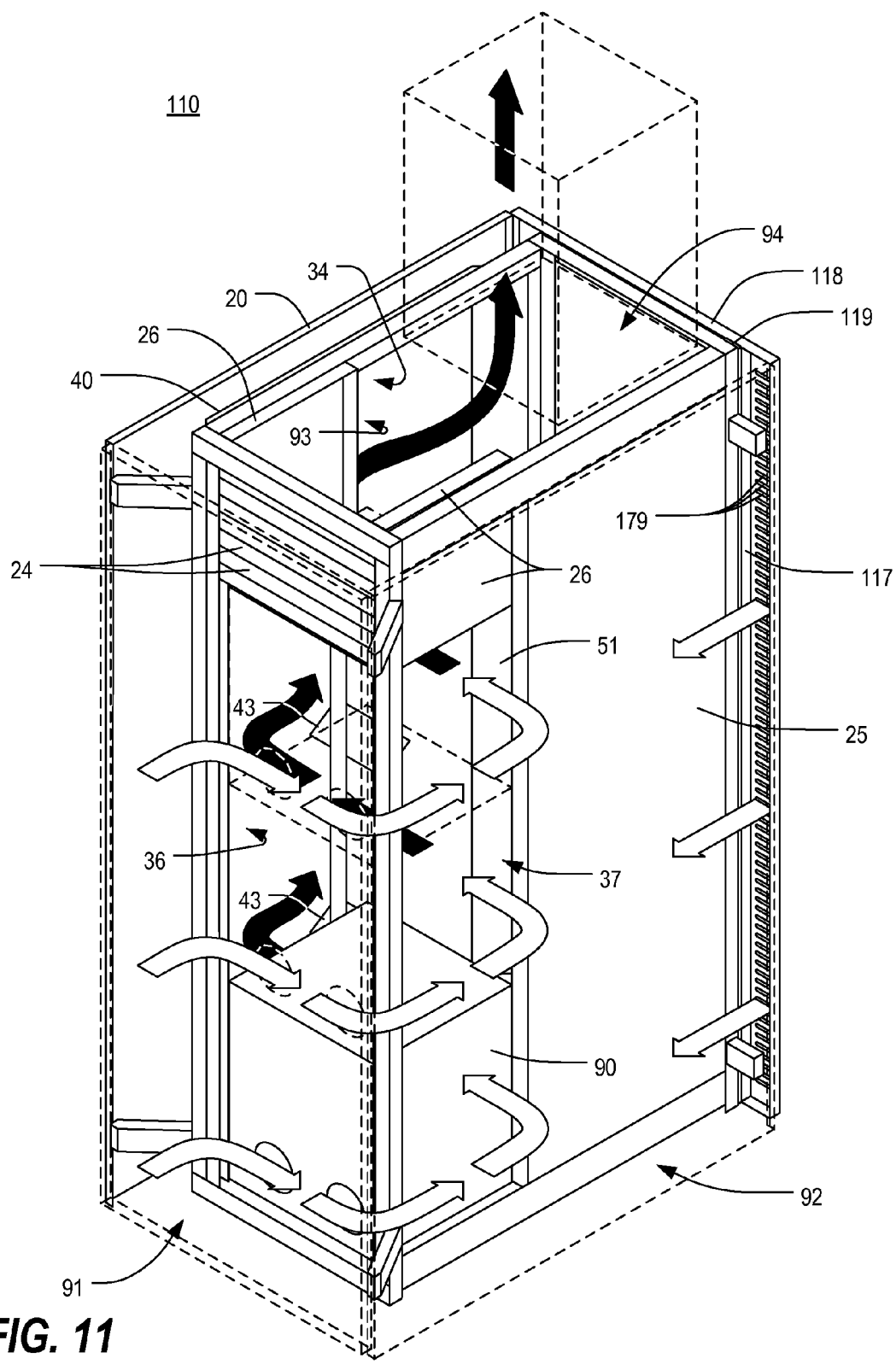
FIG. 11 is an isometric schematic view of an enclosure system similar to that of FIG. 10, but with the inclusion of one or more perforations along a side of the rear panel.

In the illustrated embodiment, each depth member 33 includes an integrated horizontal mounting rail 35 that includes two rows of mounting apertures extending along its entire length (shown, for example, in FIG. 11 of the '367 application). However, in other embodiments, the integrated horizontal mounting rails 35 may be replaced by, or supplemented with, separate mounting rails that may be disposed at the top or bottom of the vertical members 27 or at any location therebetween. Furthermore, the mounting apertures in either the integrated or separate horizontal mounting rails may be replaced by longitudinal mounting slots running substantially the length of horizontal mounting rail. Optionally, vertical mounting rails 39 may be mounted to the horizontal mounting rails 35. Each vertical mounting rail preferably includes a series of evenly-spaced, threaded mounting apertures, extending along substantially its entire length, for use in mounting electronic components, peripheral devices, cable brackets, additional mounting members, or the like thereto.

In the illustrated embodiment, two different offset brackets 12,13 are utilized, depending upon the panels being utilized. Offset brackets 12 of a first type are utilized to support a side panel 20 in parallel to, but spaced apart from, a side of the interior frame structure 14, while also supporting a front or rear panel 16,18 in parallel to, but spaced apart from, the front or rear of the interior frame structure 14, respectively. Offset brackets 13 of a second type are utilized to support a side panel 20 in parallel to, but spaced apart from, a side of the interior frame structure 14, while also supporting a front or rear panel 16,18 in abutment with the front or rear of the interior frame structure 14, respectively. Offset brackets 12 of the first type (and one or more alternative arrangements thereof) are described in greater detail in commonly-assigned U.S. patent application Ser. No. 11/837,537, published as US 2008/0035810 A1 (the "'537 application), which is incorporated herein by reference.

Furthermore, in at least one other embodiment, one or more of the panels are mounted directly to the vertical members 27 or some other portion of the interior frame structure 14 without the need for offset brackets.

In use, each offset bracket 12,13 may be mounted to the front- or rear-facing surface of a vertical member 27, as appropriate, such that it extends outwardly, away from the interior frame structure 14 in such a way as to provide orthogonal mounting surfaces at its distal end for mounting respective orthogonal panels. The offset brackets 12,13 provide versatility for a traditional frame structure by providing a means to support the various front, rear and side panels 16,18,20 away from the frame structure 14. Because the various panels 16,18,20 are thus located farther away from the equipment mounted in the interior of the frame structure 14 than panels mounted directly to the frame structure 14 would be, additional space is thus provided between the interior frame structure 14 and one or more of the side panels, front panels or (as illustrated in the '537 application) for cables, internal ducts, or other accessories. More particularly, the offset brackets 12,13 may be utilized to adapt a conventional frame structure 14 to hold larger doors and side panels than could be accommodated by the interior frame structure 14 by itself, thereby increasing the area available for cable management and/or thermal management in the side space and front and back space of a data center cabinet while creating minimal impediment to cables entering through a raised floor tile or cabinet top panel.

One or more aspects of the present invention pertain to a novel use of the spaces created, as described above, between the front and sides of the interior frame structure and the front and side panels 16,20. However, it will be appreciated by the Ordinary Artisan that the present invention is not limited to spaces created in this manner, but may also find application in other embodiments in which a space exists between the exterior panels of an electronic equipment enclosure and frame members, interior mounting members, or the like.

Figure 3:
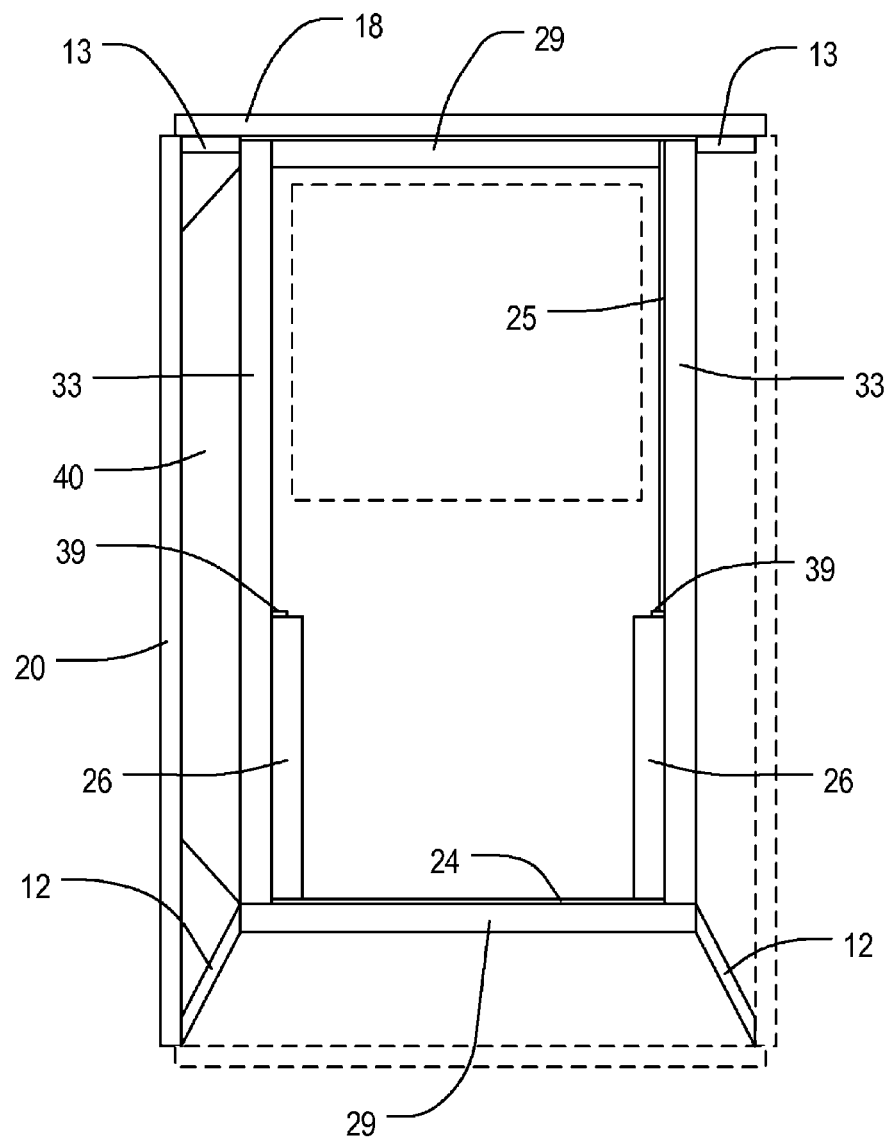
FIG. 3 is a top schematic view of the enclosure system of FIG. 2.

FIG. 3 is a top schematic view of the enclosure system 10 of FIG. 2. With reference to FIGS. 2 and 3, the side-to-side airflow control system includes a plurality of front filler panels 24, a side wall 25, two side filler panel assemblies 26, and a wall manifold 40. Together, the various elements of the airflow control system partition the interior of the enclosure into different spaces, in fluid communication with one another, that function together to guide the flow of air through the enclosure in such a way as to facilitate side-to-side airflow through equipment mounted in the enclosure. Each of these elements 24,25,26,40 are described in greater detail hereinbelow.

Figure 4A:
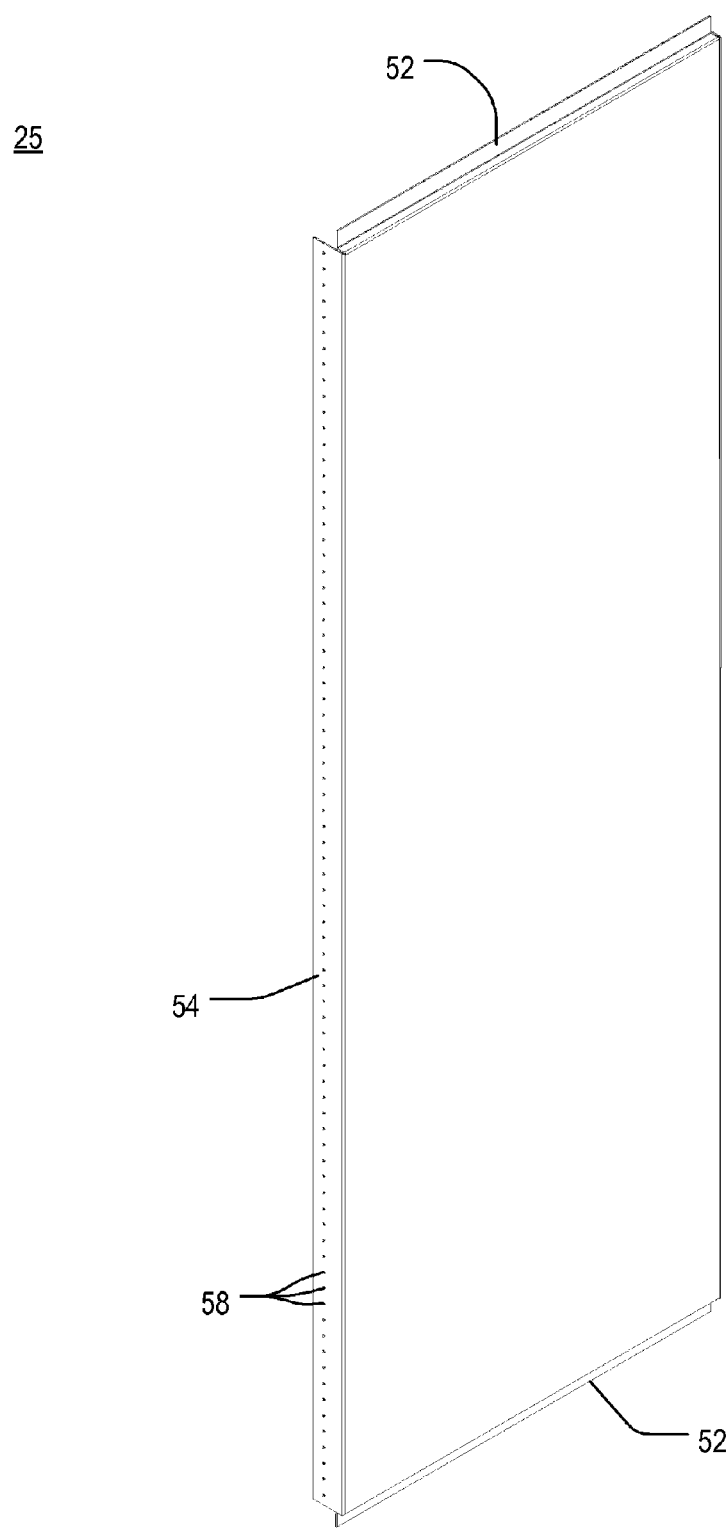
FIG. 4A is an isometric view of a side wall, in accordance with one or more preferred embodiments of the present invention, for use in the arrangement shown schematically in FIGS. 2 and 3.

FIG. 4A is an isometric view of a side wall 25, in accordance with one or more preferred embodiments of the present invention, for use in the arrangement shown schematically in FIGS. 2 and 3. As shown therein, the side wall 25 includes a large panel 51, upper and lower mounting flanges 52, and a vertical front mounting flange 54. The panel 51 is arranged to fill the space from the rearward vertical mounting rail 39 to the rear of the enclosure and from the top of the enclosure to the bottom of the enclosure. The upper and lower mounting flanges 52 permit the wall to be attached to, and supported by, the upper and lower horizontal mounting rails 35. The vertical front mounting flange 54 permits the wall to be attached to, and supported by, the rearward vertical mounting rail 39, as well as providing mounting points for one or more side filler panel assemblies 26, discussed below. In this regard, the vertical front mounting flange 54 preferably has pre-punched holes 58 that allow one or more side filler panels 26 to be attached thereto. It is preferred that self-tapping screws be used to attach the side filler panel assemblies 26 to the flanges 54; however, it will be understood that any suitable attachment means may be used. It is also preferred that the side wall 25 be constructed of sheet metal; however, it will be understood that the side wall 25 may alternatively be constructed from other suitable materials.

Figure 4B:
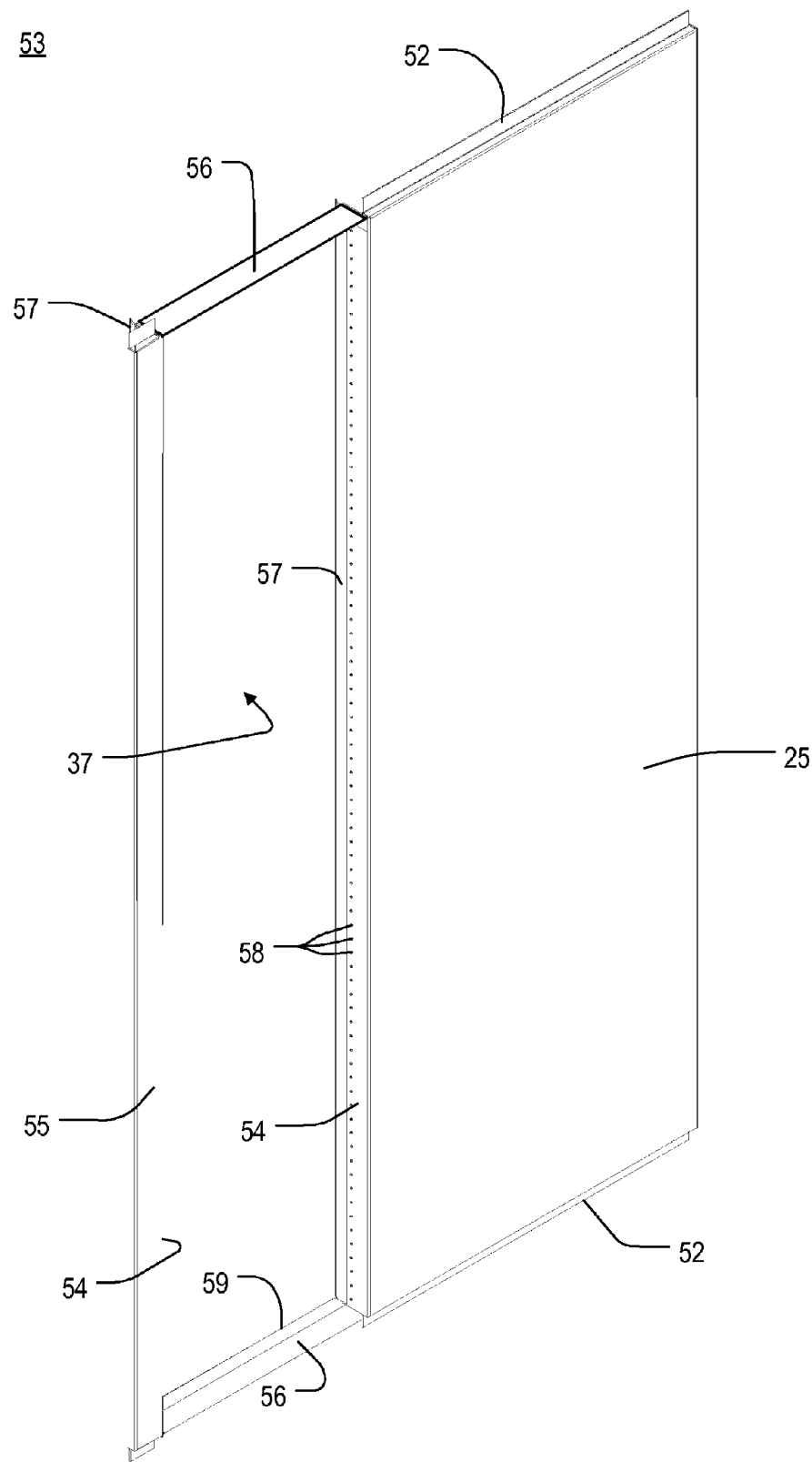
FIG. 4B is an isometric view of the side wall of FIG. 4A, shown as part of an optional side partition assembly.

FIG. 4B is an isometric view of the side wall 25 of FIG. 4A, shown as part of an optional side partition assembly 53. In addition to the side wall 25, the side partition assembly 53 also includes a second side wall 55, two horizontal mounting flanges 56, and two vertical seals 57, and may include one or more horizontal seals 59 as well. The second side wall 55 is of similar construction to the side wall 25 shown in FIG. 4A, but with a front-to-back depth that is considerably less than that of the side wall 25 of FIG. 4A, thereby enabling the second side wall 55 to serve as a filler panel abutting the front of the enclosure, a vertical member 27 or a vertical mounting rail 39. The horizontal mounting flanges 56 are attached at their ends to the vertical mounting flanges 54 and, together with the vertical mounting flanges 54 of the two side walls 25,55, frame an opening 37. The vertical rubber seals 57 are installed on the edges of the vertical mounting flanges 54, while a respective horizontal mounting flange 59 may be installed on the edge of one or both of the horizontal mounting flanges 56. The rubber seals 57,59 help to minimize air leakages around the opening 37, the importance of which will be made more apparent hereinbelow.

Figure 5A:
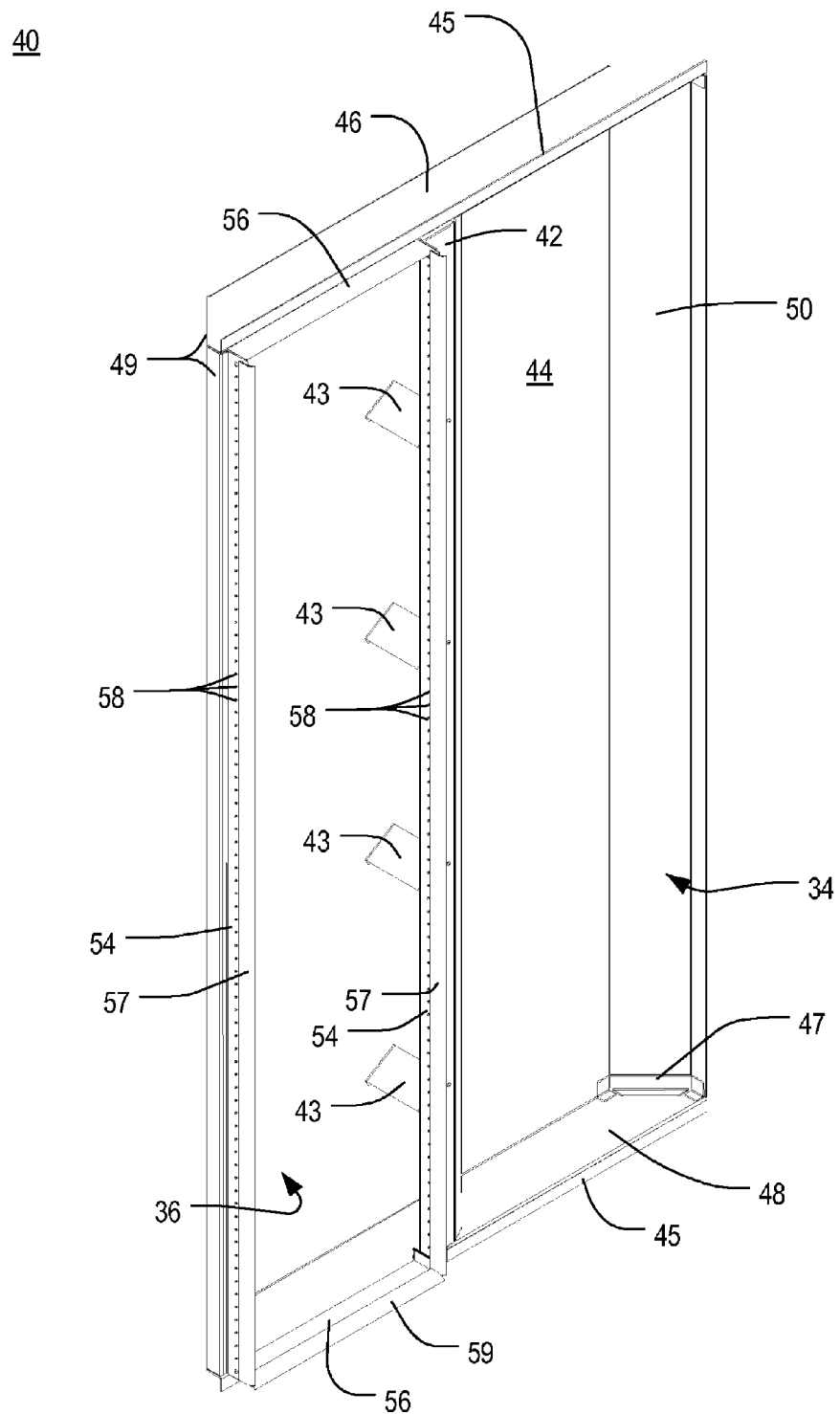
FIG. 5A is an isometric view of a wall manifold, in accordance with one or more preferred embodiments of the present invention, for use in the arrangement shown schematically in FIGS. 2 and 3.
Figure 5B:
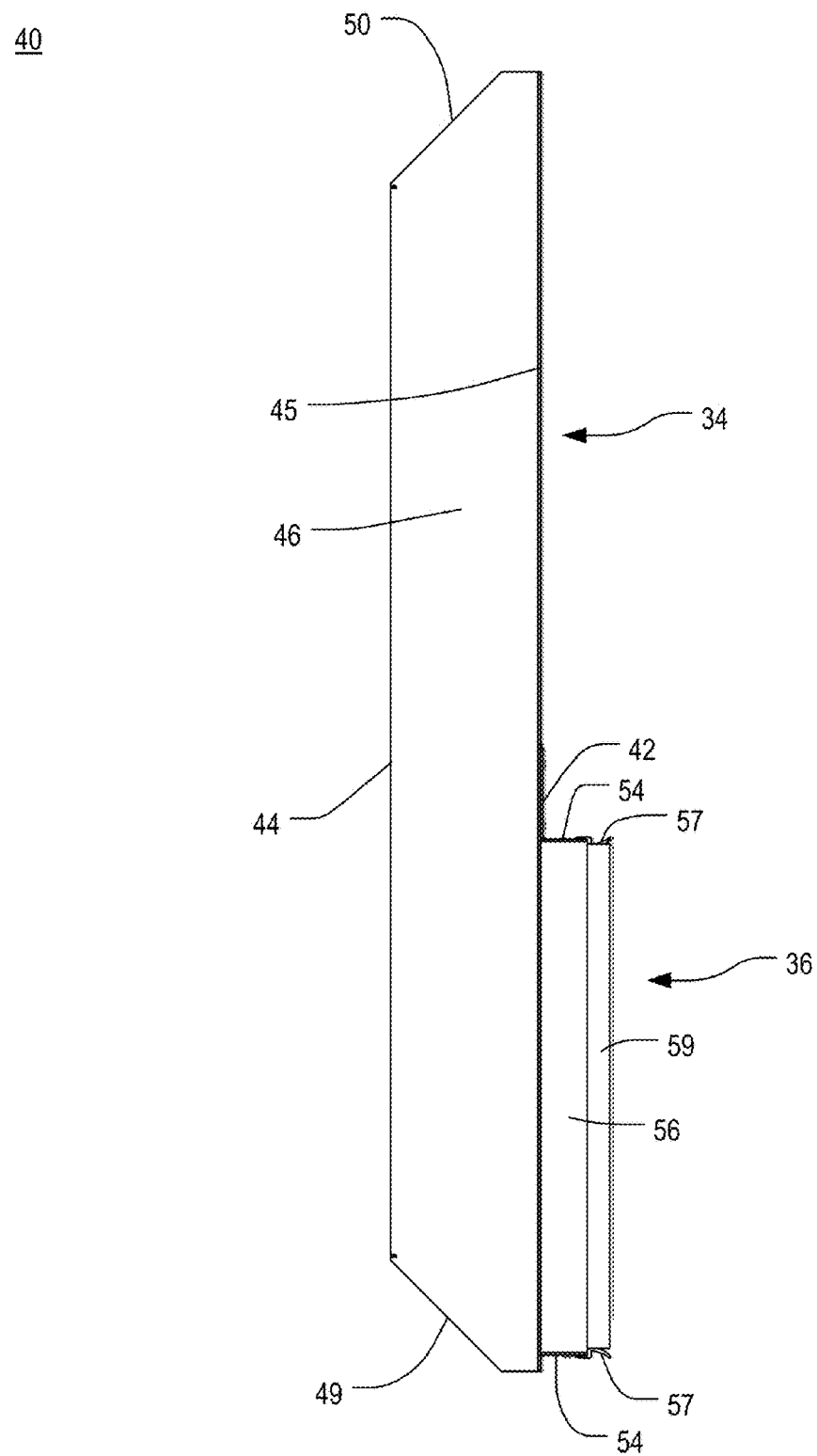
FIG. 5B is a top view of the wall manifold of FIG. 5A.

FIGS. 5A and 5B are an isometric view and a top view, respectively, of a wall manifold 40, in accordance with one or more preferred embodiments of the present invention, for use in the arrangement shown schematically in FIGS. 2 and 3. The wall manifold 40 is somewhat box-like in shape having an inner mounting post 42, an outer side wall 44, opposing top and bottom walls 46,48, and front and rear walls 49,50. A substantial portion of each of the front and rear walls 49,50 is angled, as illustrated, so as to provide better airflow control as further described hereinbelow. In some embodiments, the angled portions may be replaced with scooped portions. Each of the walls may include one or more panels. The top and bottom walls 46,48 preferably include mounting flanges 45 for attaching the manifold 40 to the upper and lower horizontal mounting rails 35. A corner bracket 47 is included in each angled corner in order to provide rigidity and to seal gaps between various walls. The inner mounting post 42 and the outer side wall 44 may be held in place relative to each other by one or more spacers 43 that also serve to redirect air upward when passing through the manifold 40 from front to rear.

A generally rectangular shaped inlet opening 36 (also visible in FIG. 2) is defined by the top and bottom walls 46,48, front portions of the mounting post 42 and the front wall 49, which enables air to flow therethrough from the front area of the enclosure system 10 into the interior of the manifold 40. A large exhaust opening 34 is defined by the top and bottom walls 46,48, rear portions of the mounting post 42 and the rear wall 50, which enables air to flow therethrough to the rear area of the enclosure 10. The wall manifold 40 thus forms a substantially enclosed structure with the exception of the inlet opening 36 and the rear outlet opening 34. When the wall manifold 40 is installed in an enclosure 10, the front wall 49 is oriented toward the front of the enclosure 10, the side wall 44 is oriented toward one of the side panels 20, and the mounting post 42 is oriented toward the interior of the enclosure 10 so that the inlet opening 36 may be aligned with the exhaust grille or grilles of equipment mounted in the enclosure 10. Thus, as will be explained more fully below, exhaust air from equipment stored in the enclosure 10 may be routed into the inlet opening 36 of the manifold 40 and may then be routed into the rear of the enclosure 10 through the rear outlet opening 34 of the manifold 40.

As perhaps best seen in FIGS. 5A and 5B, the inlet opening 36 of the wall manifold 40 includes two vertical flanges 54 and two horizontal flanges 56, similar to the flanges 54,56 of the side partition assembly 53. The vertical flanges 54 have pre-punched holes 58 that allow a filler panel assembly 26 to be attached thereto. It is preferred that self-tapping screws be used to attach the assembly 26 to the flanges 54; however, it will be understood that any suitable attachment means may be used. It is also preferred that the wall manifold 40 be constructed of sheet metal, however, it will be understood that other suitable materials may be used to construct the wall manifold 40.

Figure 6A:
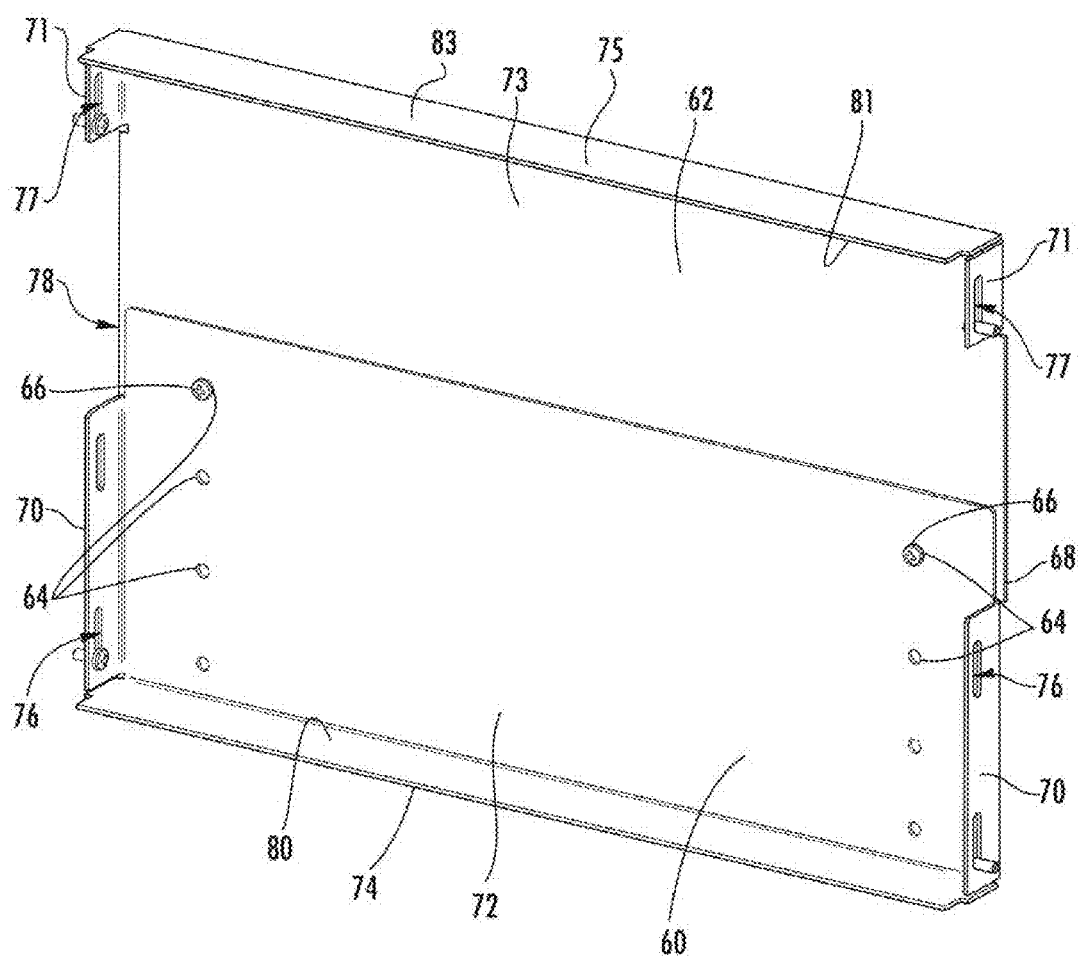
FIG. 6A is an orthogonal view of a side filler panel, in accordance with one or more preferred embodiments of the present invention, for use in the arrangement shown schematically in FIGS. 2 and 3.

FIG. 6A is an orthogonal view of a side filler panel assembly 26, in accordance with one or more preferred embodiments of the present invention, for use in the arrangement shown schematically in FIGS. 2 and 3. Each filler panel assembly 26 includes two overlapping panels 60,62. A first panel 60 includes a plurality of pairs of horizontally aligned adjustment openings 64 and a second panel 62 includes a single pair of bolts or other attachment members 66 disposed therethrough for alignment with a particular pair of the adjustment openings 64 of the first panel 60. The pair of attachment members 66 of the second panel 62 are disposed near an open end 68 of the second panel 62. A user can adjust the size of the filler panel assembly 26, and thus the portion of the inlet opening 36 of the manifold 40 covered by the filler panel assembly 26 when mounted therein, by telescoping the panel assembly up or down as appropriate and fastening the panels 60,62 together with clamping screws. It will be understood that any appropriate connection means may be used to connect the panels to one another.

Different sized filler panel assembly embodiments may be made available and used together to cover different portions of the same inlet opening 36. Exemplary sizes, as well as other information about adjustable filler panels, are disclosed in the '453 application. Of course, filler panel assemblies may be made available in any size, but in one preferred commercial implementation, three filler panel assembly embodiments are available—a small filler panel assembly (having a height of 2-3 standard rack mounting units, or RMU), a medium filler panel assembly (4-7 RMU), and a large filler panel assembly (7-15 RMU)—to accommodate various opening sizes and provide maximum versatility. In particular, the filler panel assembly 26 shown herein is the medium filler panel assembly shown in the '453 application.

With regard to the term "standard rack mounting units" or "RMU," it is well known that the vertical dimension of equipment enclosures is frequently measured in standardized units. The most common unit of measurement is the "rack mounting unit" ("RMU"). According to accepted standards, an RMU is defined as 1.75 inches in height. Electrical components as well as accessories, which include horizontal raceways, patch panels, and the like, are also commonly measured in RMUs. For example, a 2 RMU component is one which is 3.50 inches or less in height. Thus, a rack which has 45 RMUs may accommodate components and accessories totaling 45 RMUs. Further, to conserve space, components and accessories are frequently installed only at vertical locations corresponding to a whole number of RMUs in order to avoid interfering with adjacent components and accessories. Further information about the term "standard rack mounting units" or "RMU" is available in U.S. Pat. No. 7,119,282 to Krietzman, et al., the entirety of which is incorporated herein by reference.

Accordingly, in at least some embodiments, the pairs of horizontally aligned adjustment openings 64 in the first panel 60 are spaced 1 RMU from each other; i.e., each pair of openings 64 is 1 RMU from the pair above and/or below it. Furthermore, in at least some embodiments, the lines of holes or apertures 58 in each vertical flange 54 are spaced ½ RMU apart; i.e., each aperture 58 is ½ RMU from the one above and/or below it. This facilitates the sizing of the assembly 26 in increments of a whole number of RMUs, and adjustment of the assembly 26 in the opening 36 in ½-RMU increments. Such adjustability advantageously makes it easier to size and align exhaust openings created by the upper or lower edges of the assembly with equipment on a whole- or half-RMU incremental basis.

In another embodiment (not shown), the plurality of pairs of horizontally aligned adjustment openings 64 in the first panel 60 are replaced by a pair of vertical slots, thereby permitting continuous length adjustment of the respective assembly 26. More particularly, the attachment members 66 may be positioned anywhere in the vertical slots, i.e., from the tops of the slots to the bottoms, thereby allowing the assembly 26 to be adjusted exactly to any desired length, rather than limiting adjustment to one-RMU increments.

Each panel 60,62 of each assembly 26 includes a pair of opposing side flanges 70,71, extending from side edges of the panel 60,62 and disposed on opposite side edges at the closed end 72,73 of the panel 60,62, and an end flange 74,75, extending from the closed end 72,73 of the panel 60,62 and disposed in abutting relation with the pair of side flanges 70,71. The opposing side flanges 70,71 and end flanges 74,75 provide additional rigidity and support to the respective panels 60,62, which enhances the stability of the enclosure 10. Each side flange 70,71 has therein at least one elongate slot 76,77, aligned with a corresponding slot 76,77 in the opposite side flange 70,71, for connection of the panels 60,62 to the vertical flanges 54 of the inlet opening 36 of the wall manifold 40. Utilizing elongate slots 76,77 rather than round openings enables vertical adjustability and versatility in connecting the panels 60,62 to the wall manifold 40. In addition, the use of a slotted connection enables a user to push neighboring panels flush against one another to form a seal that minimizes leakage. Also, the slotted connections allow for slight manufacturing errors to be compensated for. When a panel assembly 26 is installed in the inlet opening 36, it is preferred that vertical rubber seals 57, perhaps better illustrated in the '453 application, are interposed between the vertical flanges 54 of the inlet opening 36 of the exhaust duct 12 and the side flanges 70,71 of the panel assembly 26. The rubber seals 57 help to minimize air leakages from the wall manifold 40 back into the interior of the cabinet.

The side flanges 70 of the first panel 60 extend substantially the entire length of the sides of the panel 60. However, portions 78 of the sides of the panel 60 are left open, i.e., are left without side flanges 70. The length of each open side portion 78 corresponds to the location of the pair of adjustment openings 64 closest to the open end 68 of the panel 60. As such, there are no side flanges 70 aligned with the pair of adjustment openings 64 located closest to the open end 68 of the panel 60. The side flanges 70 of the first panel 60 each include one or more elongate slots 76. In particular, the side flanges 70 of the illustrated first panel 60 include a plurality of pairs of elongate slots 76. In the second panel 62, the side flanges 71 are relatively short. The length of the side flanges 71 of the second panel 62 are preferably just long enough to accommodate the pair of elongate slots 77 thereof, though in some embodiments the side flanges may be longer.

It is preferred that the filler panels 60,62 be constructed of sheet metal, however, it is to be understood that alternative materials may be used. In fact, the filler panels may be made of any suitable solid material or non-porous fabric. For example, a field-sized fabric construct or a retractable roll of fabric could be developed to selectively close the inlet opening 36 of the wall manifold 40. Alternatively, the wall manifold 40 could be constructed with multiple knock-out openings with or without retrofit filler panels to seal the knock-out openings that are no longer desired.

Figure 6B:
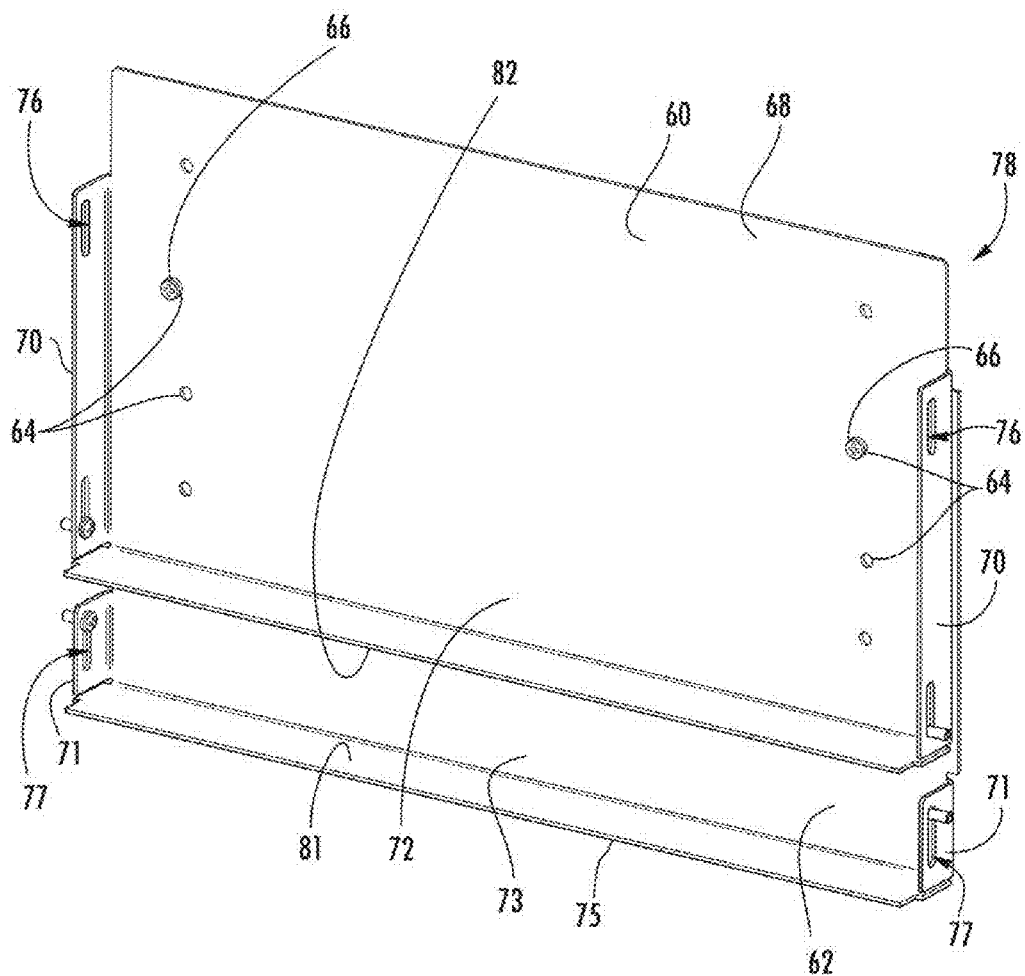
FIG. 6B is an orthogonal view of the adjustable filler panel assembly of FIG. 6A, shown in an alternative configuration.

The filler panel assembly 26 may be configured in two ways, as shown in FIGS. 6A and 6B. In particular, FIG. 6A illustrates the filler panel assembly 26 arranged in a first or close-ended configuration, while FIG. 6B illustrates the same filler panel assembly 26 arranged in a second or open-ended configuration. In the close-ended configuration (FIG. 6A), the pair of adjustment openings 64 closest to the open end 68 of the first panel 60 is aligned with and connected to the bolts or other attachment members 66 of the second panel 62. As such, the end flange 74 of each respective first panel 60 is in opposing facing relation to the end flange 75 in the second panel 62, and together the flanges 74,75 form outer end boundaries of the panel assembly 26. In this close-ended configuration, the end flanges 74,75 are as far apart from one another as they can be with the panels 60,62 of the assembly 26 being connected. It will be appreciated that in this configuration, only a small portion of the panels actually overlap one another. Still further, as shown in FIG. 6A, the close-ended configuration arranges the end flanges 74,75 of the first and second panels 60,62 in a manner such that each is positioned along the periphery of the assembly 26. In this regard, the end flanges 74,75 reinforce the overall rigidity and stability of the filler panel assembly 26 when installed.

Figure 9:
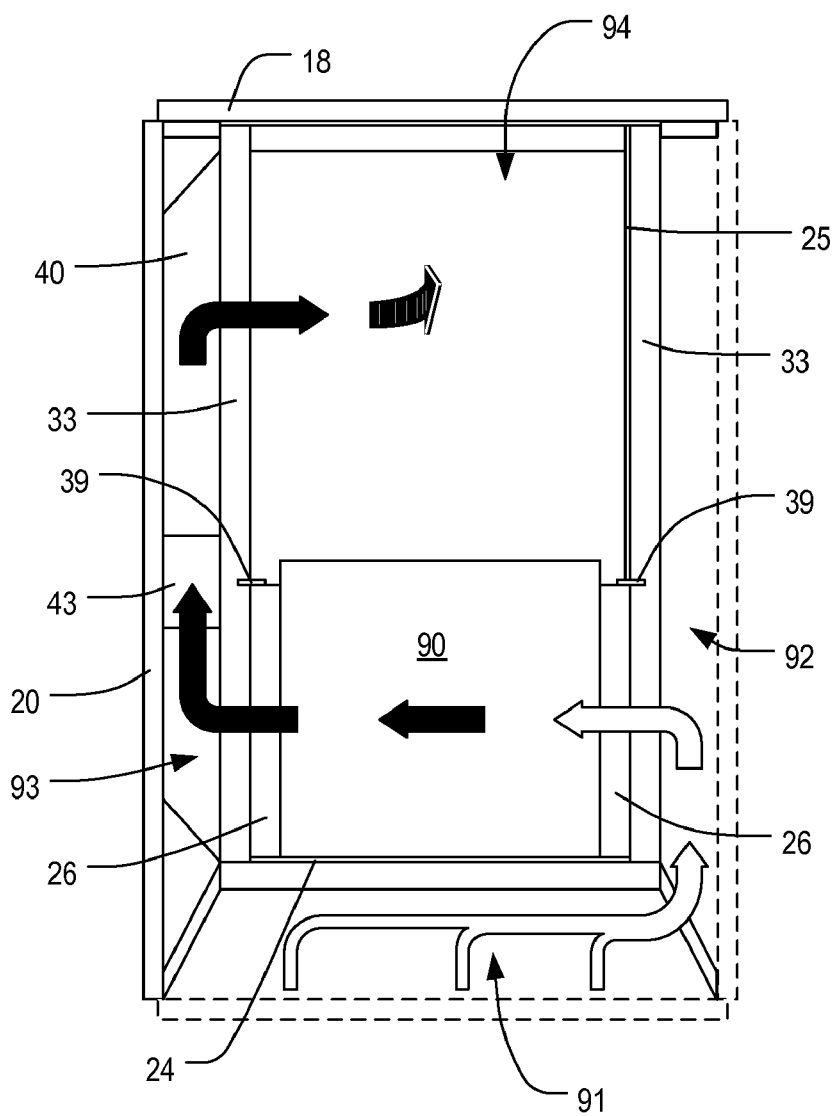
FIG. 9 is a top cross-sectional schematic view of the enclosure system of FIG. 8, taken along line 9-9.

In the open-ended configuration (FIG. 6B), the second panel 62 is rotated 180 degrees and the first panel 60 is slid so that it overlaps a substantial portion of the length of the second panel 62. The pair of bolts or other attachment members 66 of the second panel 62 are aligned with and connected to the pair of adjustment openings 64 that are second closest to the open end 68 of the first panel 60. In this configuration, an interior side 81 of the end flange 75 of the second panel 62 is in opposing relation with an exterior side 82 of the end flange 74 of the first panel 60. Further, in this configuration, the end flanges 74,75 are as close to one another as they can be with the panels 60,62 being connected. Furthermore, as shown in FIG. 6B, the open end 68 of the first panel 60 extends away from the panel assembly 26. In this regard, the panel assembly 26 is permitted to be installed at or near the flanges 56 of the manifold 40, as shown in FIG. 9 of the '453 application. Advantageously, when the filler panel assembly 26 is arranged in the open-ended configuration, the exposed open end 68 of the first panel 60 permits the filler panel assembly 26 to be installed without the flanges 56 of the manifold 40 otherwise obstructing the installation.

Figure 7:
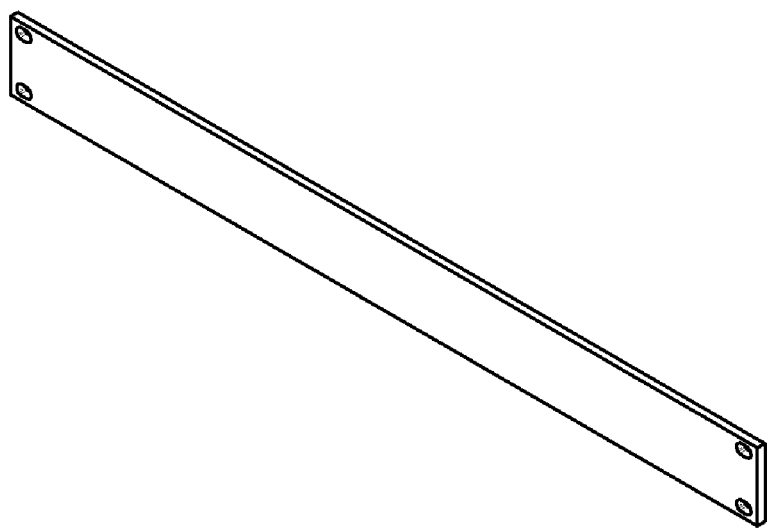
FIG. 7 is an isometric view of a front filler panel, in accordance with one or more preferred embodiments of the present invention, for use in the arrangement shown schematically in FIGS. 2 and 3.

FIG. 7 is an isometric view of a front filler panel 24, in accordance with one or more preferred embodiments of the present invention, for use in the arrangement shown schematically in FIGS. 2 and 3. Each filler panel 24 is preferably a whole number of RMUs in height and is wide or long enough to be mounted to the front of the vertical members 27 using apertures penetrating therethrough. In particular, in at least one embodiment, each filler panel 24 is one RMU in height. The number of filler panels 24 utilized is dependent upon the amount of space to be filled above the top of the equipment. In the illustrated arrangement, seven filler panels 24, totaling seven RMUs in height, are utilized in order to accommodate servers 90 as shown in FIG. 8, described below.

The elements of the side-to-side airflow control system of the present invention are particularly well adapted to route cooling air from the front of en electronic equipment enclosure to one side of equipment mounted therein, through the equipment to the opposite side of the equipment, and then to the rear of the enclosure where it may be exhausted through the top of the enclosure or through the rear of the enclosure. In particular, such an approach may be utilized to cool server equipment that utilizes side-to-side airflow to promote the cooling thereof. This is further illustrated and described hereinbelow.

Figure 8:
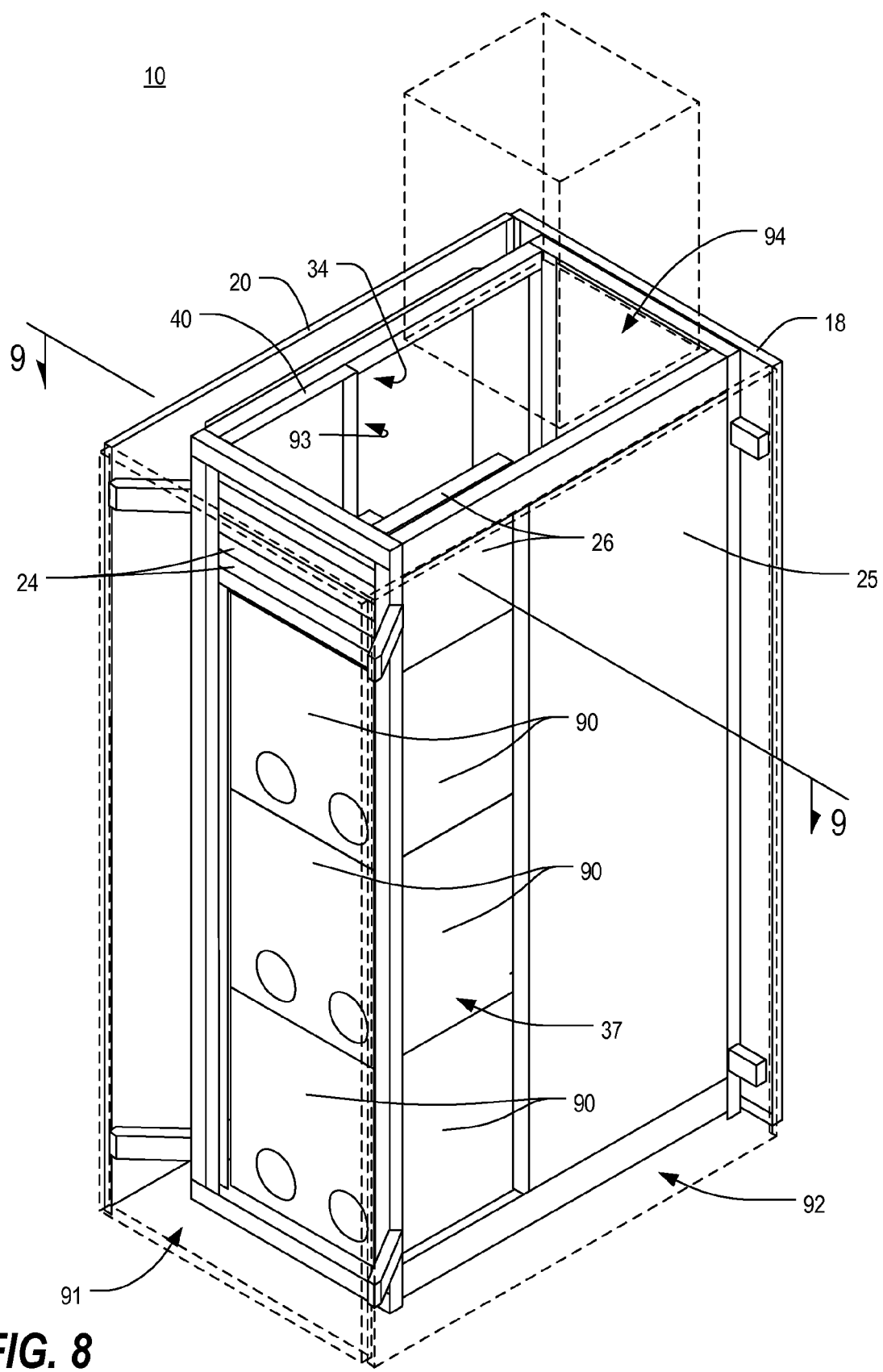
FIG. 8 is an isometric schematic view similar to that of FIG. 2, shown with three servers, utilizing side-to-side cooling, installed therein.

FIG. 8 is an isometric schematic view similar to that of FIG. 2, shown with three servers 90, utilizing side-to-side cooling, installed therein. In the arrangement depicted therein, it is assumed that each server is of a type that receives cooling air through one or more intakes located on the right side and exhausts it via one or more outlets on the left side. It will be appreciated that the various elements 24,25,26,40 of the airflow control system, the rear and side 18,20 and the exterior surfaces of the servers 90 themselves create a front plenum 91, a right side plenum 92, a left side plenum 93 and a rear plenum 94. It will be further appreciated that the front plenum 91 is in fluid communication with the right side plenum 92, that the left side plenum 93 is in fluid communication with the rear plenum 94 via the exhaust opening 34 of the manifold 40, and that the rear plenum 94 is in fluid communication with the interior of the vertical exhaust duct 15. Still further, it will be appreciated that the intakes of the servers 90 are in fluid communication with the right side plenum 92 via the side wall opening 37, and that the outlets of the servers 90 are in fluid communication with the left side plenum 93 via the manifold inlet opening 36.

Figure 10:
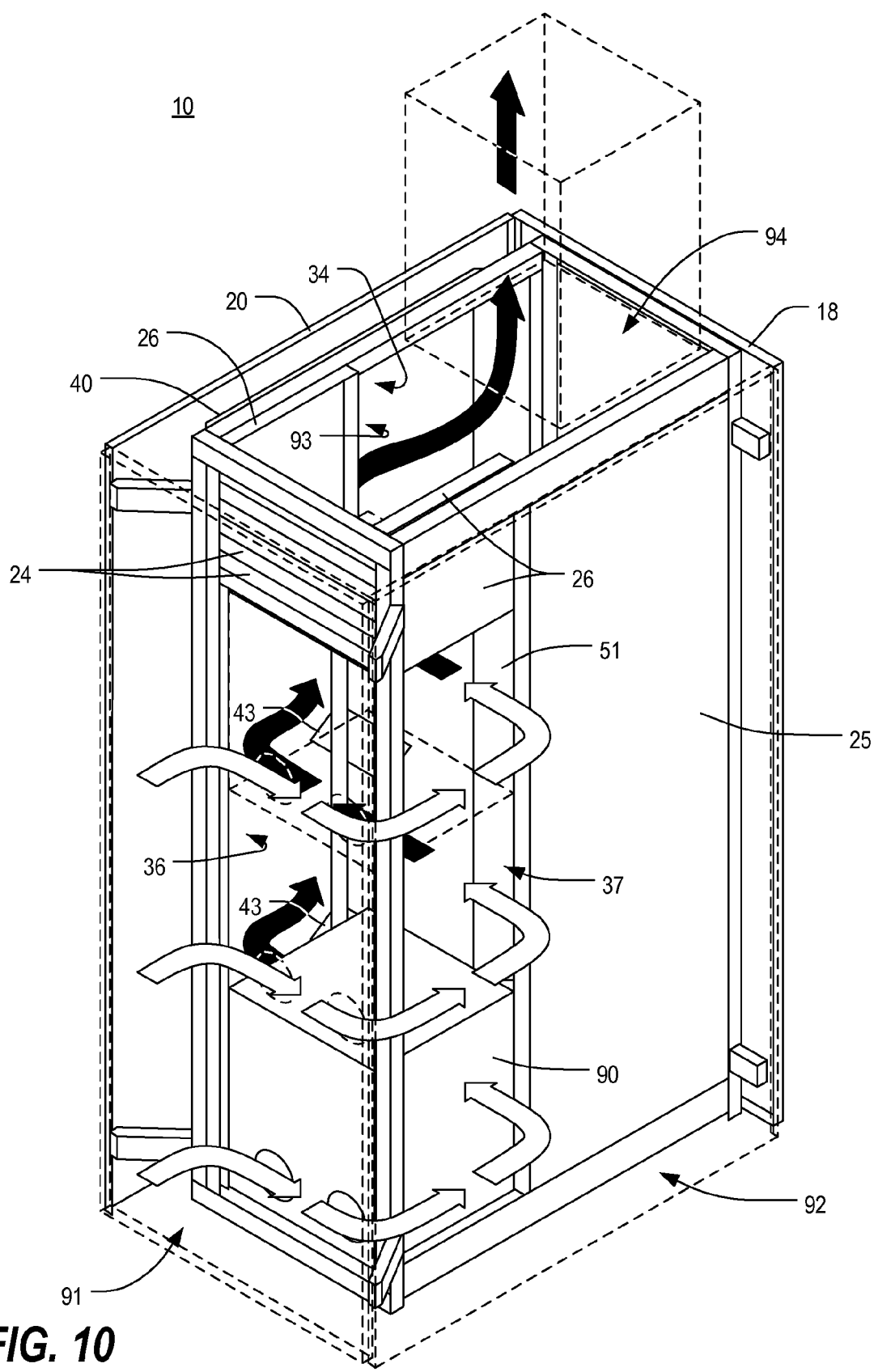
FIG. 10 is an isometric schematic view similar to that of FIG. 8, but with the location of one of the servers shown in broken lines.

FIG. 9 is a top cross-sectional schematic view of the enclosure system 10 of FIG. 8, taken along line 9-9, and FIG. 10 is an isometric schematic view similar to that of FIG. 8, but with the location of one of the servers 90 shown in broken lines. As shown therein, cooling air (represented in FIGS. 9 and 10 by large white arrows) is first routed through the front of the enclosure and into the front plenum 91. This may be accomplished via vents or other openings in the front panel 16, by opening a front door (where the front panel 16 includes one or more doors) or by removing the front panel 16. The cooling air is then routed through the side wall opening 37 and into the intakes of the servers 90. Exiting the servers 90, the heated exhaust air (represented in FIGS. 9 and 10 by large black arrows) is routed through the manifold inlet opening 36, through the manifold 40 (being redirected upward by the spacers 43), and out through the exhaust opening 34 into the rear plenum 94. From the rear plenum 94, the heated exhaust air is routed up and out of the enclosure through the vertical exhaust duct 15.

FIG. 11 is an isometric schematic view of an electronic equipment enclosure system 110 similar to that of FIG. 10, but with the inclusion of one or more perforations 179 along a side of the rear panel 118. The enclosure system 110 of FIG. 11 is identical in construction and operation to that which is depicted in FIG. 10, except that the rear panel 118 includes one or more perforations 179 at a side thereof. Additionally, a gasket 119 is situated at the interior frame structure 14 and is positioned to sealingly engage with a portion 117 of the rear panel 118, thereby permitting cooling air (represented in FIG. 11 with large white arrows) to enter through the rear panel 118 and into the right side plenum 92 without intermingling with exhaust air being routed through the rear plenum 94. It is further contemplated that either or both of the rear panel portion 117 and the gasket 119 may exist in the enclosure system 110 without the perforations 179. It will be appreciated that the perforations, although shown as a column of slots in the embodiment of FIG. 11, may take any conventional form, including vertical slots, screen mesh, and small round circles.

In the enclosure system 118 of FIG. 11, cooling air is permitted to enter the right side plenum through both the rear panel 118 (via the perforations 179) and the front panel 16 (via the front plenum 91). Furthermore, it is also within the scope of the present invention that the perforations 179 in the rear panel 118 may be the sole source of cooling air entering the right side plenum 92.

Based on the foregoing information, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof.

What is claimed is:

1. An electronic equipment enclosure system with a side-to-side airflow control system, comprising:
    (a) an enclosure, having a front, a rear, a top, a bottom and two sides;
    (b) a side-to-side airflow control system, including:
        (i) a side wall disposed adjacent one side of the enclosure, and
        (ii) a manifold disposed adjacent the other side of the enclosure; and
    (c) electronic equipment disposed between the side wall and the manifold;
    (d) wherein the manifold includes:
        (i) an outer side wall,
        (ii) a front wall,
        (iii) a rear wall,
        (iv) an inward-facing inlet opening, and
        (v) an inward-facing exhaust opening,
        (vi) wherein heated exhaust air exits the electronic equipment, then enters the manifold through the inlet opening and then exits the manifold through the exhaust opening.

2. The electronic equipment enclosure system of claim 1, wherein the electronic equipment has a front, a rear, a top, a bottom and two sides, wherein cooling air is routed into a first of the two sides of the electronic equipment, wherein heated exhaust air is routed out of a second side of the two sides of the electronic equipment and into the manifold, and wherein the side wall of the side-to-side airflow control system prevents the heated exhaust air from mixing with the cooling air at the first side of the electronic equipment.

3. The electronic equipment enclosure system of claim 2, further comprising an opening in the top of the enclosure and an exhaust duct on the top of the enclosure and in fluid communication with the interior of the enclosure via the opening.

4. The electronic equipment enclosure system of claim 2, wherein the side-to-side airflow control system is adapted to route heated exhaust air from the manifold through an opening in the top of the enclosure and into an exhaust duct disposed on the top of the enclosure.

5. The electronic equipment enclosure system of claim 1, further comprising at least one adjustable filler panel assembly disposed above the electronic equipment to prevent air from passing from side to side over the electronic equipment, disposed below the electronic equipment to prevent air from passing from side to side under the electronic equipment, disposed above the electronic equipment to prevent air from passing from front to back over the electronic equipment, or disposed below the electronic equipment to prevent air from passing from front to back under the electronic equipment.

6. The electronic equipment enclosure system of claim 1, wherein:
    (a) the front and rear walls each include an angled portion, extending substantially the full height of the manifold, for redirecting air striking thereagainst;
    (b) the manifold further includes a top wall and a bottom wall;
    (c) the inward-facing inlet opening is defined at least partially by the front wall, the top wall, and the bottom wall; and
    (d) the inward-facing exhaust opening is defined at least partially by the rear wall, the top wall, and the bottom wall.

7. The electronic equipment enclosure system of claim 6, wherein at least a portion of the air entering the manifold through the inlet opening is redirected by the angled portion of the front wall toward the rear wall.

8. The electronic equipment enclosure system of claim 6, wherein at least a portion of the air traveling from front to back within the manifold is redirected by the angled portion of the rear wall toward the exhaust opening.

9. The electronic equipment enclosure system of claim 6, wherein the manifold further includes an inner mounting post, the inner mounting post opposing the outer side wall.

10. The electronic equipment enclosure system of claim 9, wherein the inner mounting post includes an inwardly-angled portion at the rear thereof.

11. The electronic equipment enclosure system of claim 9, wherein the inward-facing inlet opening is further defined by the front edge of the inner mounting post.

12. The electronic equipment enclosure system of claim 9, wherein the inward-facing exhaust opening is further defined by the rear edge of the inner mounting post.

13. The electronic equipment enclosure system of claim 9, wherein the manifold further includes at least one spacer connecting the inner mounting post to the outer side wall.

14. The electronic equipment enclosure system of claim 13, wherein the at least one spacer is planar in shape.

15. The electronic equipment enclosure system of claim 13, wherein the at least one spacer is angled upwardly to redirect air upward when the air is passing through the manifold from front to rear.

16. An electronic equipment enclosure system with a side-to-side airflow control system, comprising:
    (a) an electronic equipment enclosure;
    (b) an exhaust duct disposed atop the electronic equipment enclosure; and
    (c) panels that define a first plenum in a front region of the electronic equipment enclosure, a second plenum in a first side region of the electronic equipment enclosure, a third plenum in a second side region of the electronic equipment enclosure, and a fourth plenum in a rear region of the enclosure, wherein the second side region is on the opposite side of the enclosure from the first side region;
    (d) wherein the first plenum is in fluid communication with the second plenum, the second plenum is in fluid communication with a first side of an equipment mounting location, the third plenum is in fluid communication with a second side of the equipment mounting location, the fourth plenum is in fluid communication with the third plenum and with the exhaust duct, and the second side of the equipment mounting location is on the opposite side of the equipment mounting location from the first side thereof; and
    (e) wherein the panels are arranged such that cooling air enters the first plenum, passes from the first plenum into the second plenum, passes from the second plenum through the equipment mounting location and into the third plenum as heated exhaust air, and the heated exhaust air passes from the third plenum into the fourth plenum and from the fourth plenum to the exhaust duct.

17. The electronic equipment enclosure system of claim 16, wherein the third plenum is established by a manifold having an inward-facing inlet opening and an inward-facing exhaust opening.

18. The electronic equipment enclosure system of claim 17, wherein the manifold includes at least one spacer to redirect air when the air is passing through the third plenum.

19. The electronic equipment enclosure system of claim 18, wherein the at least one spacer is planar in shape.

20. The electronic equipment enclosure system of claim 19, wherein the at least one spacer is angled to redirect air upwardly.

21. The electronic equipment enclosure system of claim 16, wherein a rear cover of the electronic equipment enclosure includes one or more perforations to permit cooling air to enter directly into the second plenum.

* * * * *